United States Patent
Gouramanis

(10) Patent No.: US 8,929,077 B2
(45) Date of Patent: Jan. 6, 2015

(54) THERMAL CONNECTOR

(71) Applicant: TEM Products Inc., Lindenhurst, NY (US)

(72) Inventor: Dean Gouramanis, Lindenhurst, NY (US)

(73) Assignee: TEM Products Inc., Lindenhurst, NY (US)

( * ) Notice: Subject to any disclaimer, the term of this patent is extended or adjusted under 35 U.S.C. 154(b) by 206 days.

(21) Appl. No.: 13/633,977

(22) Filed: Oct. 3, 2012

(65) Prior Publication Data

US 2013/0170145 A1 Jul. 4, 2013

Related U.S. Application Data

(60) Provisional application No. 61/582,454, filed on Jan. 2, 2012, provisional application No. 61/623,052, filed on Apr. 11, 2012, provisional application No. 61/643,345, filed on May 7, 2012.

(51) Int. Cl.
| H05K 7/20 | (2006.01) |
| H05K 1/02 | (2006.01) |
| G06F 1/20 | (2006.01) |
| H05K 3/00 | (2006.01) |

(52) U.S. Cl.
CPC ............ H05K 1/0209 (2013.01); H05K 1/0204 (2013.01); *H05K 3/0061* (2013.01); *H05K 2201/10106* (2013.01); *H05K 2201/10409* (2013.01); *H05K 2201/10416* (2013.01); *H05K 2201/10969* (2013.01)
USPC ...... 361/709; 361/679.54; 361/704; 361/710; 361/719; 165/80.2; 165/80.3; 165/104.33

(58) Field of Classification Search
USPC ............... 361/679.46, 679.54, 688, 689–697, 361/700–712, 715, 719–724; 165/80.2, 165/80.3, 104.33, 185; 257/707, 713, 718, 257/719, 720, 706; 174/16.3, 252, 260; 362/294, 249.02, 373; 29/825–852, 29/890.03
See application file for complete search history.

(56) References Cited

U.S. PATENT DOCUMENTS

| 4,046,442 | A |   | 9/1977  | Hutchison |
| 4,340,902 | A |   | 7/1982  | Honda et al. |
| 4,420,767 | A |   | 12/1983 | Hodge et al. |
| 4,802,532 | A |   | 2/1989  | Dawes et al. |
| 4,924,352 | A |   | 5/1990  | Septfons |
| 5,010,949 | A | * | 4/1991  | Dehaine ..................... 165/76 |

(Continued)

FOREIGN PATENT DOCUMENTS

EP    002096685 A1 * 9/2009

*Primary Examiner* — Michail V Datskovskiy
(74) *Attorney, Agent, or Firm* — Carter, DeLuca, Farrell & Schmidt, LLP

(57) ABSTRACT

A thermal connector for use with a printed circuit board assembly is disclosed. The thermal connector includes a top segment configured for thermal engagement with a heat source disposed on a top surface of a printed circuit board and for insertion through an opening of the printed circuit board to thermally engage the heat source. A middle segment of the thermal connector extends from the top segment and includes a flanged portion configured to engage a bottom surface of the printed circuit board when the top segment is inserted through the opening of the printed circuit board. A bottom segment of the thermal connector extends from the middle segment and is configured for thermal engagement to a heat dissipating element.

20 Claims, 30 Drawing Sheets

(56) References Cited

U.S. PATENT DOCUMENTS

| | | | |
|---|---|---|---|
| 5,014,904 A * | 5/1991 | Morton | 228/176 |
| 5,644,163 A * | 7/1997 | Tsuji | 257/706 |
| 5,828,625 A * | 10/1998 | Costa | 367/13 |
| 5,920,458 A | 7/1999 | Azar | |
| 6,304,451 B1 * | 10/2001 | Rife | 361/704 |
| 6,674,643 B2 | 1/2004 | Centola et al. | |
| 7,686,480 B2 * | 3/2010 | Chien et al. | 362/294 |
| 7,736,027 B2 * | 6/2010 | Ge | 362/294 |
| 7,817,434 B2 * | 10/2010 | Hattis | 361/748 |
| 7,898,077 B2 * | 3/2011 | Storch | 257/707 |
| 8,071,998 B2 * | 12/2011 | Chen | 257/99 |
| 8,278,559 B2 * | 10/2012 | Loiselet et al. | 174/252 |
| 8,391,009 B2 * | 3/2013 | Horng et al. | 361/707 |
| 2006/0131602 A1 * | 6/2006 | Ouderkirk et al. | 257/100 |
| 2008/0265400 A1 | 10/2008 | Pan et al. | |
| 2010/0315813 A1 | 12/2010 | Fugerer et al. | |

\* cited by examiner

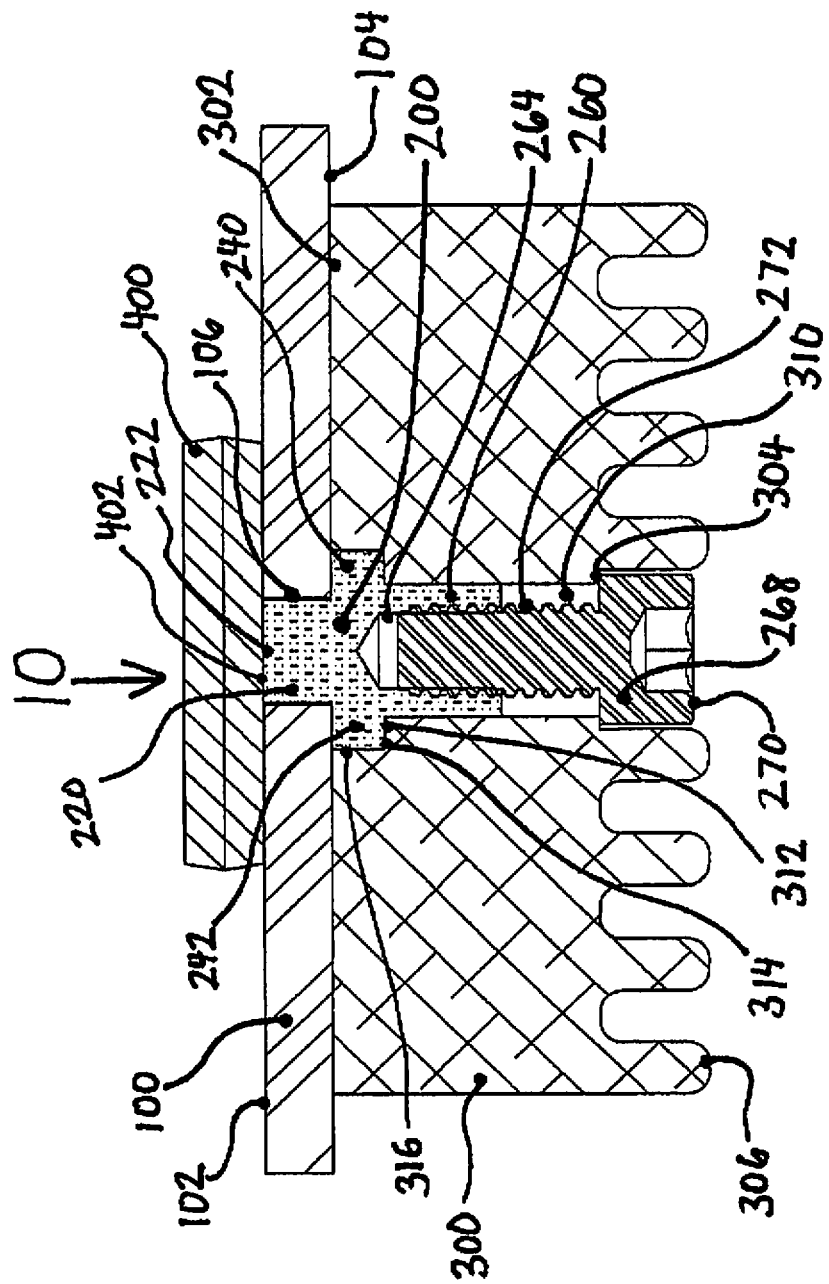

THERMAL CONNECTOR

CROSS-REFERENCE TO RELATED APPLICATIONS

This application claims priority to, and the benefit of U.S. Provisional Patent Application Ser. No. 61/582,454, filed Jan. 2, 2012; U.S. Provisional Patent Application Ser. No. 61/623,052, filed Apr. 11, 2012; and U.S. Provisional Patent Application Ser. No. 61/643,345, filed May 7, 2012, the entire contents of each of which is incorporated herein by reference.

BACKGROUND

1. Technical Field

The present disclosure relates a device for improved heat dissipation from electrical components mounted on a printed circuit board. More specifically, the present disclosure relates to a thermal connector for thermal engagement with a surface mount electrical component through a printed circuit board to dissipate thermal energy from the surface mount electrical component through the printed circuit board to a heat dissipating element.

2. Background of Related Art

Many surface mount electronic components feature a thermal vent or exposed die pad located on the bottom side of the component. This metal surface serves as a thermally conductive pathway for heat to flow away from the electronic component. Many common configurations within a printed circuit board (PCB) assembly fail to remove heat adequately.

A common design technique for spreading heat away from the die pad is to connect the die pad with solder, to a copper layer, which is embedded within the printed circuit board. Although the copper layer is very thin, its thermal conductivity is very high, making this technique somewhat effective. However, this technique often fails to provide an adequate thermal pathway for high powered electronic components. In addition, because heat is required to melt solder, fusing solder directly to a heat dissipation device would be difficult if not impossible.

Traditionally, a surface mount component is placed onto the top surface of a printed circuit board at precisely the right location. Connection pins extend from the component, resting on copper pads that are built into the PCB. Solder is applied to the copper pads by a stencil and squeegee. When all components and solder are placed on the board, the board is carefully moved into a reflow soldering oven to melt the solder and fuse the connections to the PCB. When removed from the oven, the solder solidifies, securing the components to the PCB.

Modern PCB manufacturing facilities are highly automated. Solder paste is applied to PCBs using stencils and components are placed on the PCBs using robotic arms. Components are then fused to the PCB using reflow soldering ovens. One disadvantage, however, is a lack of precision with which printed circuit board assemblies are constructed. Apertures made in a printed circuit board using standard techniques often vary considerably in diameter. Variances of 0.006 inches are considered acceptable for most applications.

SUMMARY

Further details and aspects of exemplary embodiments of the present invention are described in more detail below with reference to the appended Figures.

A two part heat dissipation system including a thermal connector and a heat dissipater or radiator is disclosed. The thermal connector is soldered to the electronic component and the head dissipater or radiator is mechanically fastened to the thermal connector. In this manner a thermal pathway can be achieved through the use of both solder and a mechanical connection.

A thermal connector for use with a printed circuit board assembly is disclosed. The thermal connector includes a top segment configured for insertion through an opening of a printed circuit board to thermally engage a heat source disposed on a top surface of the printed circuit board. A middle segment of the thermal connector extends from the top segment and includes a flanged portion configured to engage a bottom surface of the printed circuit board when the top segment is inserted through the opening of the printed circuit board. A bottom segment of the thermal connector extends from the middle segment and is configured for thermal engagement to a heat dissipating element.

In an aspect of the present disclosure, the top segment includes a top surface configured for engagement with the heat source and the flanged portion of the middle segment includes a bottom surface configured for engagement with the heat dissipating element. The surface area of the bottom surface of the flanged portion of the middle segment may be greater than the surface area of the top surface of the top segment or may be substantially equal to the surface area of the top surface of the top segment.

In an aspect of the present disclosure, the thermal connector is at least partially fabricated from at least one conductive material. The thermal connector may also be plated with at least one of gold and silver.

In an aspect of the present disclosure, the middle segment of the thermal connector includes a paint or a lacquer applied thereon. The paint or lacquer is configured to inhibit the flow of solder thereacross.

In an aspect of the present disclosure, the middle segment is configured for at least partial insertion into a receptacle of the heat dissipating element.

In an aspect of the present disclosure, the heat source is a surface mount electrical component.

A thermal dissipation system for use with a printed circuit board assembly is disclosed including a printed circuit board having a heat source disposed on a first surface thereof and an opening extending therethrough from the first surface to a second surface adjacent the heat source. A thermal connector is inserted through the opening of the printed circuit board to thermally engage at least one of the heat source and the printed circuit board in thermal communication. The thermal connector is configured to dissipate heat away from at least one of the heat source and the printed circuit board. A heat dissipating element is attached to the thermal connector and is configured to dissipate heat received by the thermal connector from the at least one of the heat source and the printed circuit board.

In an aspect of the present disclosure, the heat source is a surface mount electrical component.

In an aspect of the present disclosure, the surface mount electrical component is a light emitting diode.

In an aspect of the present disclosure, the heat dissipating element is configured to attach to more than one thermal connector.

In an aspect of the present disclosure, the opening is disposed below the heat source.

In an aspect of the present disclosure, the thermal connector includes a top segment, a middle segment extending from the top segment, and a bottom segment extending form the middle segment. The top segment is configured for insertion through the opening to engage the at least one of the heat source and the printed circuit board in thermal communication.

In an aspect of the present disclosure, the middle segment includes a flange extending radially therefrom and configured for engagement with the bottom surface of the printed circuit board when the top segment is inserted through the opening in the printed circuit board.

In an aspect of the present disclosure, the bottom segment is configured for insertion into a receptacle extending through the heat dissipating element and configured for mechanical securement thereto.

In an aspect of the present disclosure, the thermal dissipation system further includes a fixation element configured for insertion through the receptacle of the heat dissipating element. The fixation element is configured to engage the bottom segment and the heat dissipating element to secure the bottom segment to the heat dissipating element.

In an aspect of the present disclosure, the receptacle of the heat dissipating element is configured to at least partially receive a flange of the middle segment.

A thermal dissipation system for use with a printed circuit board assembly is disclosed including a printed circuit board having a plurality of openings extending therethrough from a first surface to a second surface and a plurality of heat sources disposed on the first surface. Each heat source is disposed adjacent to one of the openings. The thermal dissipation system further includes a plurality of thermal connectors. Each thermal connector is inserted through one of the openings to engage a respective one of the heat sources in thermal communication and is configured to dissipate heat away from the respective one of the heat sources. At least one heat dissipating element is attached to the plurality of thermal connectors and is configured to dissipate heat received by the plurality of thermal connectors from the plurality of heat sources.

It is contemplated that any of the above disclosed aspects may be combined without departing from the scope of the present disclosure.

BRIEF DESCRIPTION OF THE DRAWINGS

Embodiments of the present disclosure are described herein with reference to the accompanying drawings, wherein:

FIG. 1G. is a side, cross-sectional view of the thermal dissipation system of FIG. 1A;

DETAILED DESCRIPTION OF EMBODIMENTS

Figure 1A:
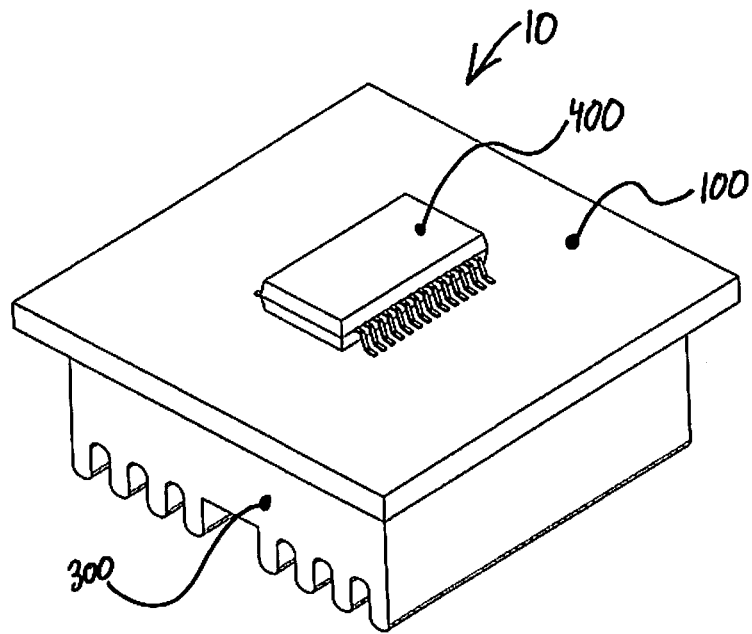
FIG. 1A is a perspective view of a thermal dissipation system according to the present disclosure.
Figure 1B:
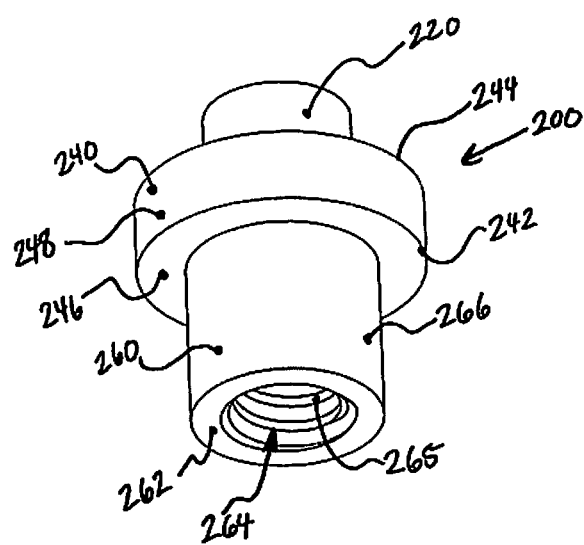
FIGS. 1B-1C are perspective views of a thermal connector of the thermal dissipation system of FIG. 1A.

Embodiments of the presently disclosed thermal dissipation system are described in detail with reference to the drawings, in which like reference numerals designate identical or corresponding elements in each of the several views.

Thermal energy transfer is dependent on several factors including, the thermal conductivity of the material, the cross sectional area of the thermal pathway, the length of the thermal pathway, and the difference in temperature between the source and destination. The purpose of a heat dissipater or radiator is to maintain the temperature of an electronic component at a minimum. For this reason it is beneficial to provide an adequately sized thermal pathway made of a highly thermally conductive material. In addition, each component in the thermal pathway must be properly thermally connected.

One beneficial aspect of the presently disclosed thermal dissipation system is the ability to apply a thermal transfer medium such as, for example, solder, epoxy or thermal grease, directly to the die pad of a surface mount electrical component. The use of a thermal transfer medium creates a thermal interface between two components having improved thermal transfer characteristics. The use of a thermal transfer medium to connect a thermal connector to the surface mount component also enables seamless integration with modern manufacturing techniques including, for example, solder stenciling, pick and place robotics, and reflow soldering.

The presently disclosed thermal connectors are optimized for transferring thermal energy away from a heat source, e.g., the surface mount electrical component to a heat dissipation element or heat sink, e.g., a dissipater or radiator. For example, the presently disclosed thermal connector includes at least a first thermal interface configured for thermal connection to the die pad of the surface mount component and a second thermal interface configured for thermal connection to a dissipater/radiator. The first thermal interface may be soldered to the die pad of the surface mount component while the second thermal interface is mechanically engaged to the dissipater/radiator. The thermal connector is designed such that the second thermal interface always has a higher contact area than the first thermal interface to maximize thermal transfer away from the surface mount component. Thermal transfer is further increased by providing a thermal connector having flat surfaces that are parallel to corresponding surfaces on the dissipater/radiator.

Figure 8A:
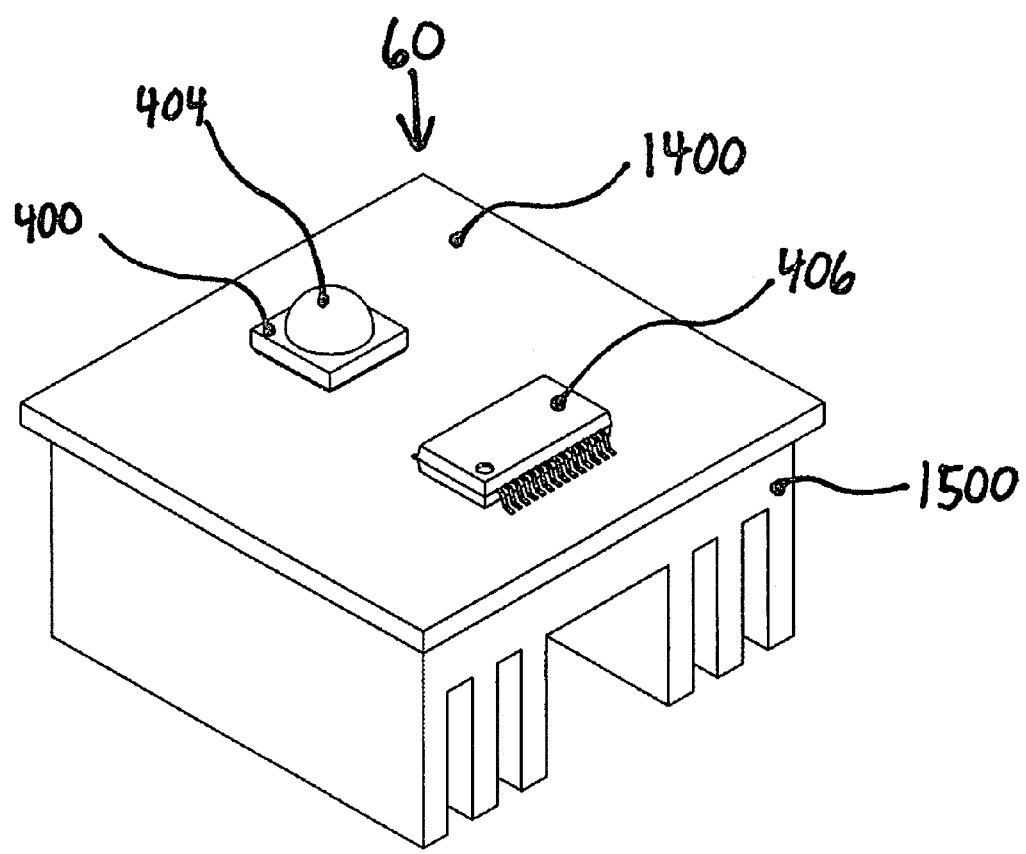
FIG. 8A is a perspective view of a thermal dissipation system according to another embodiment of the present disclosure.
Figure 8B:
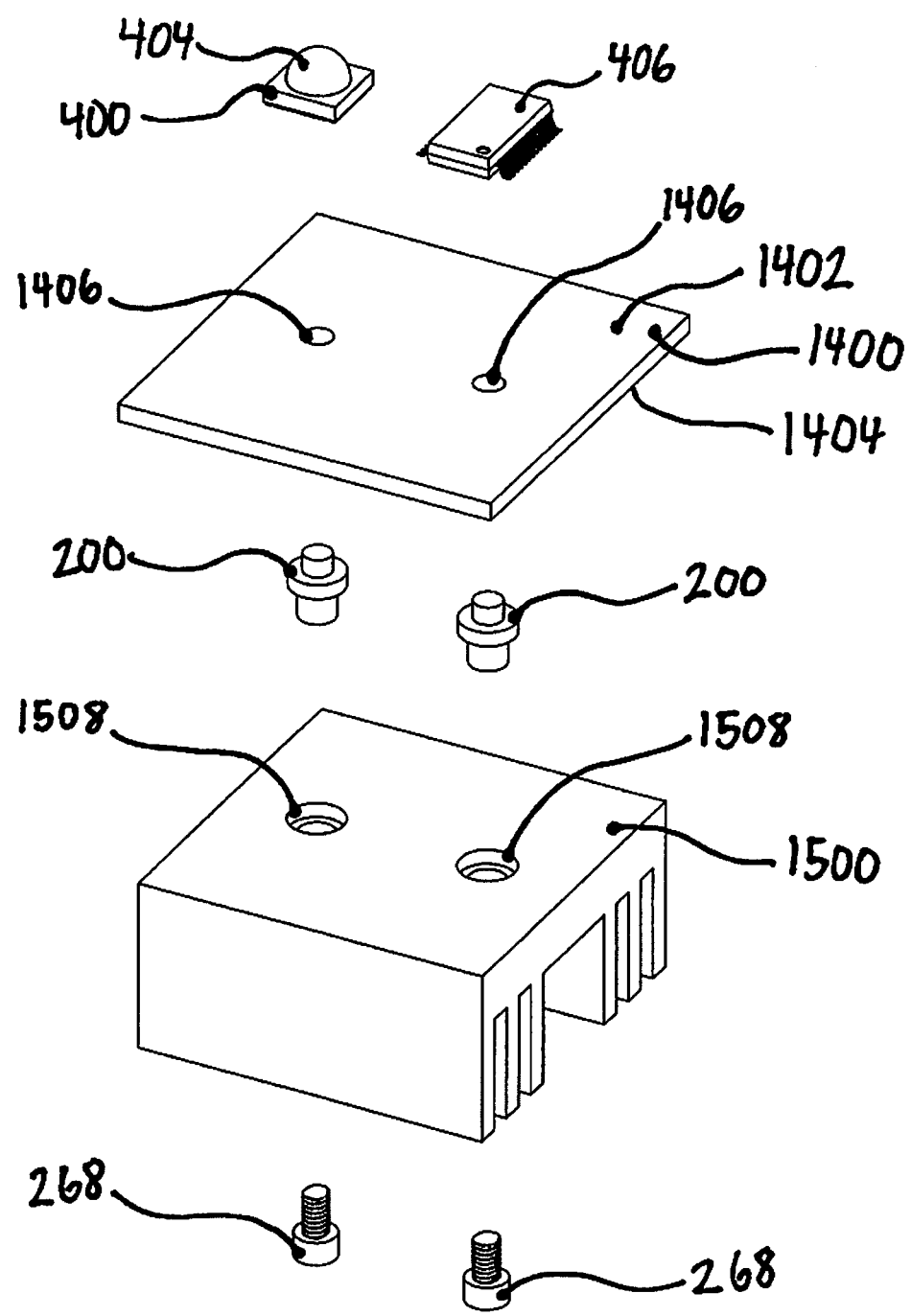
FIG. 8B is a perspective view of the thermal dissipation system of FIG. 8A, with the components separated.
Figure 8C:
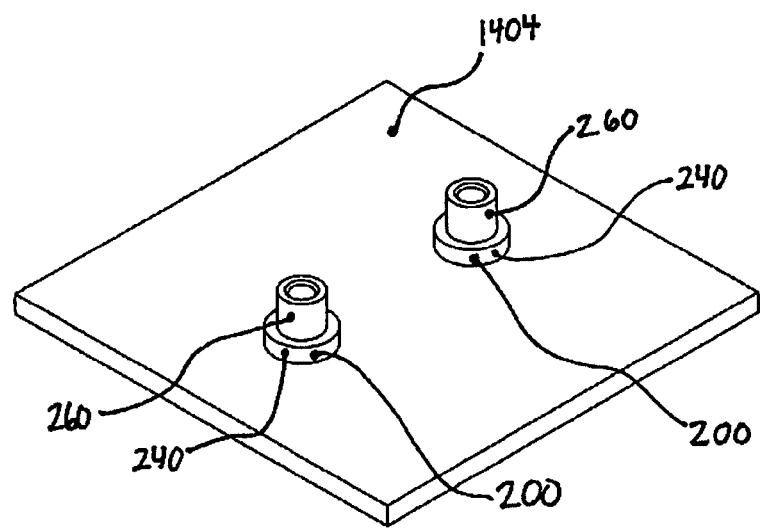
FIG. 8C is a perspective view of the bottom surface of the PCB of FIG. 8A, illustrating a thermal connector inserted into the PCB.
Figure 8D:
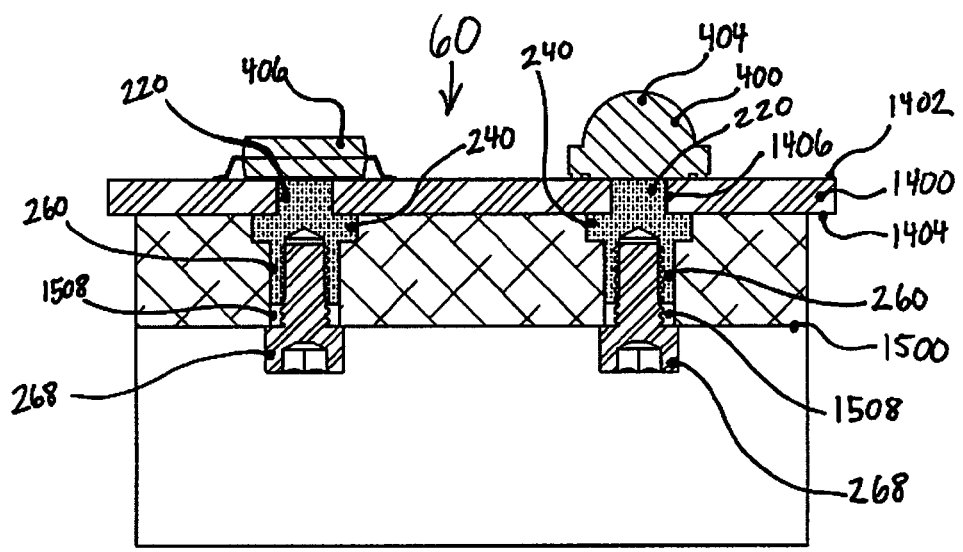
FIG. 8D is a side, cross-sectional view of the thermal dissipation system of FIG. 8A.

Referring initially to FIGS. 1A-1G, a thermal dissipation system in accordance with an embodiment of the present disclosure is shown and generally designated 10. Thermal dissipation system includes a printed circuit board (PCB) 100, a thermal connector 200, a heat dissipation element such as a dissipater or radiator 300 and at least one surface mount component 400. Surface mount components 400 may be any surface mount electrical component including, for example, a light emitting diode 402 (FIG. 8A), a driver circuit 404 (FIG. 8A), voltage regulators, diodes, transistors, amplifiers, motor controllers, specialty IC's, microprocessors, or other electrical circuits or components commonly used with PCBs.

PCB 100 includes a top surface 102 (FIG. 1E) for mounting the at least one surface mount component 400 thereon, and a bottom surface 104 (FIG. 1F) opposite top surface 102. Each surface mount component 400 is configured to be mounted over an opening 106 extending through PCB 100 from the top surface 102 to the bottom surface 104 such that a die pad 402 (FIG. 1F) of the surface mount component 400 is substantially aligned with the opening 106.

Figure 1C:
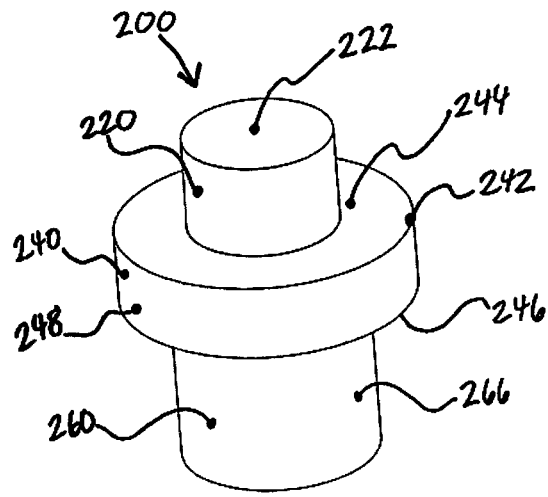
Figure 1D:
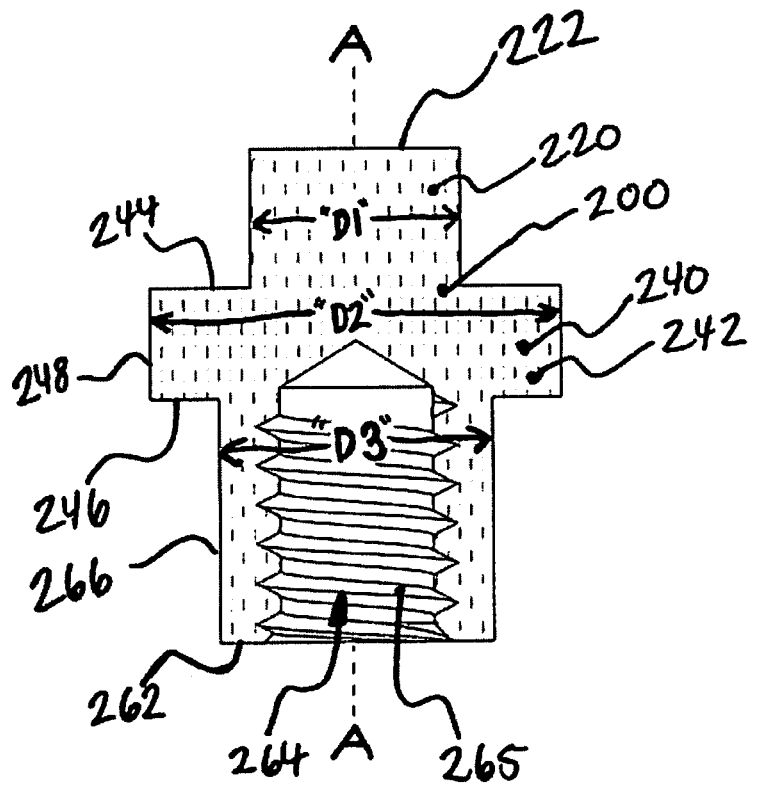
FIG. 1D is a cross-sectional view of the thermal connector of FIG. 1B.

Referring now to FIGS. 1B-1D and 1G, thermal connector 200 includes a top segment 220, a middle segment 240 and a bottom segment 260. Top segment 220 includes a top surface 222 and defines a first cross-sectional diameter "D1". Top segment 220 is configured and dimensioned for insertion through one of openings 106 such that top surface 222 engages or otherwise contacts a surface mount component 400 mounted over the opening 106. For example, top surface 222 engages the die pad 402 of the surface mount component 400 when inserted through the opening 106. In this manner thermal connector 200 is disposed in thermal communication with surface mount component 400. Top surface 222 may be substantially aligned with top surface 102 of PCB 100 or may be slightly raised relative to top surface 102 when top segment 220 inserted through the one of openings 106. Solder, thermal paste, or other similar thermal communication mediums may be disposed between or adjacent to top segment 220 and the die pad 402 of surface mount component 400 to provide greater thermal communication between thermal connector 200 and surface mount component 400. Top segment 220 may have a substantially cylindrical shape, as shown in FIG. 1C, or may alternatively have other polygonal shapes without departing from the scope of the present disclosure. For example, top segment 220 may define a square shape, triangular shape, prismatic shape, oval shape, or other similar shapes suitable for insertion into an opening 106. Opening 106 may have substantially the same shape as top segment 220 such that opening 106 is configured and dimensioned to receive top segment 220 therein.

Middle segment 240 of thermal connector 200 defines a second cross-sectional diameter "D2". Middle segment 240 includes a flange 242 having a top surface 244, a bottom surface 246, and a side surface 248. Top surface 244 is configured to engage against the bottom surface 104 of PCB 100 when top segment 220 is inserted into opening 106 to inhibit top segment 220 from being over inserted through opening 106 and to align thermal connector 200 relative to PCB 100 such that top surface 222 of top segment 220 is substantially parallel to top surface 102 of PCB 100. Bottom surface 246 and side surface 248 are configured to thermally engage radiator 300 when radiator 300 is attached to thermal connector 200, as will be described in further detail below.

Bottom segment 260 of thermal connector 200 defines a third cross-sectional diameter "D3" and includes a bottom surface 262 having a threaded bore 264 extending therein and a side surface 266. Threaded bore 264 includes a female thread 265 (FIG. 1B) and is configured to receive a screw 268 (FIGS. 1E-1G) therein for securing radiator 300 to thermal connector 200.

Thermal connector 200 may be axially symmetric about a longitudinal axis A-A (FIG. 1D) and each segment 220, 240, 260 may include a different sized diameter "D1", "D2", "D3", respectively, depending on the particular surface mount component 400 with which the thermal connector 200 will be used. For example, first and third diameters "D1" and "D3" may be smaller than second diameter "D2". First diameter "D1" may be smaller than third diameter "D3", first diameter "D1" may be substantially the same as third diameter "D3", or first diameter "D1" may be larger than third diameter "D3".

To maximize the thermal transfer through thermal connector 200 from the surface mount component 400 to the radiator 300, it is important that the surface area of the bottom surface 246 of the flange 242 of middle segment 240 be at least equal to or greater than the surface area of the top surface 222 of top segment 220. For example, when bottom surface 246 of flange 242 has a surface area that is equal to or greater than the surface area of the top surface 222 of top segment 220, the thermal energy received at top surface 222 of top segment 220 will be able to flow through thermal connector 200 and out of the bottom surface 246 of flange 242 unrestricted. On the other hand, having a bottom surface 246 of flange 242 that has a smaller surface area than top surface 222 may inhibit or bottleneck the flow of thermal energy through the thermal connector 200 and result in a reduced thermal dissipation from surface mount component 400 to radiator 300. Providing a bottom surface 246 of flange 242 having a larger surface area than the surface area of top surface 222 of top segment 220 further facilitates improved heat transfer away from the surface mount component.

Figure 1E:
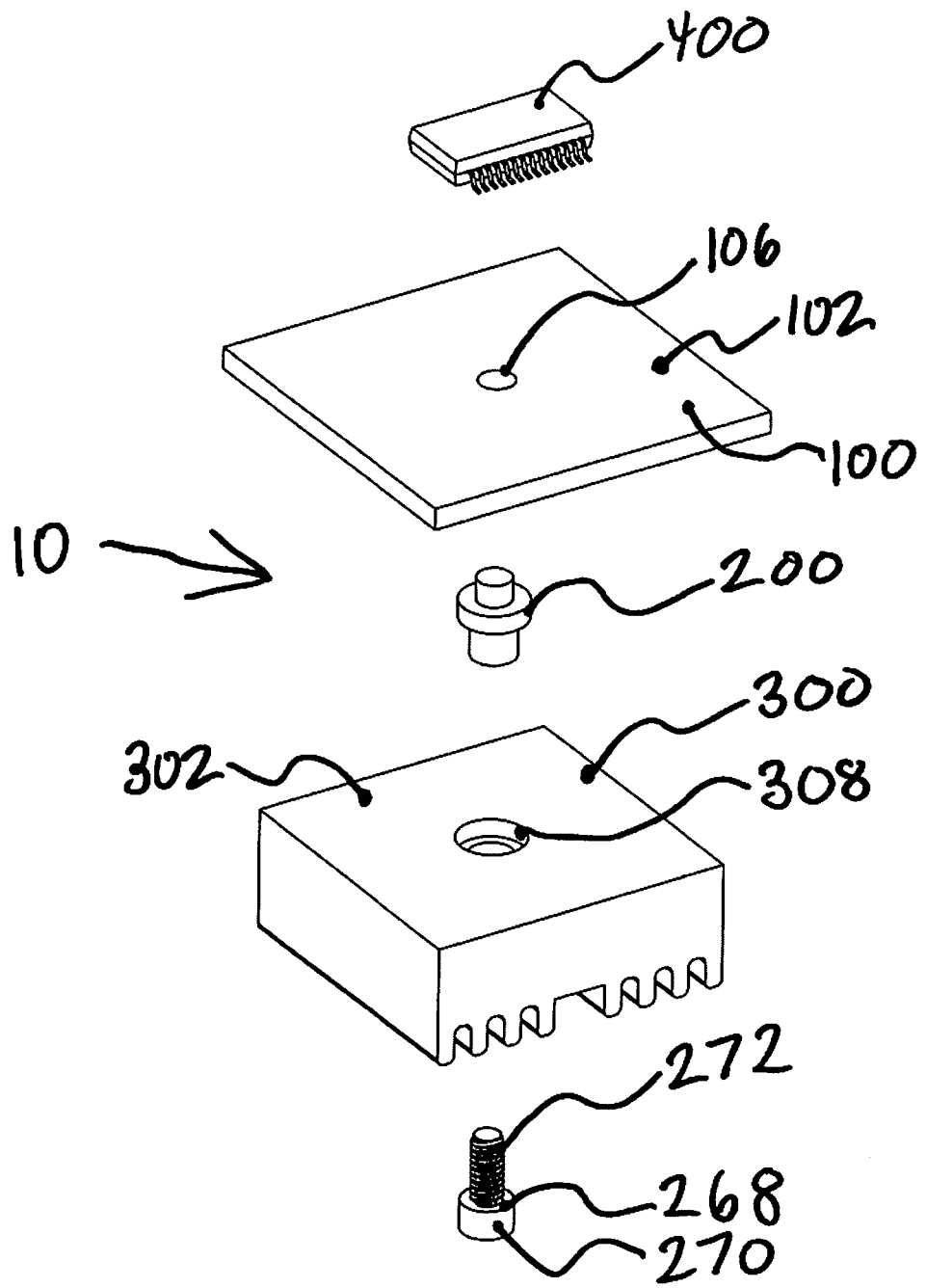
FIGS. 1E and 1F are perspective views of the thermal dissipation system of FIG. 1A, with the components separated.
Figure 1F:
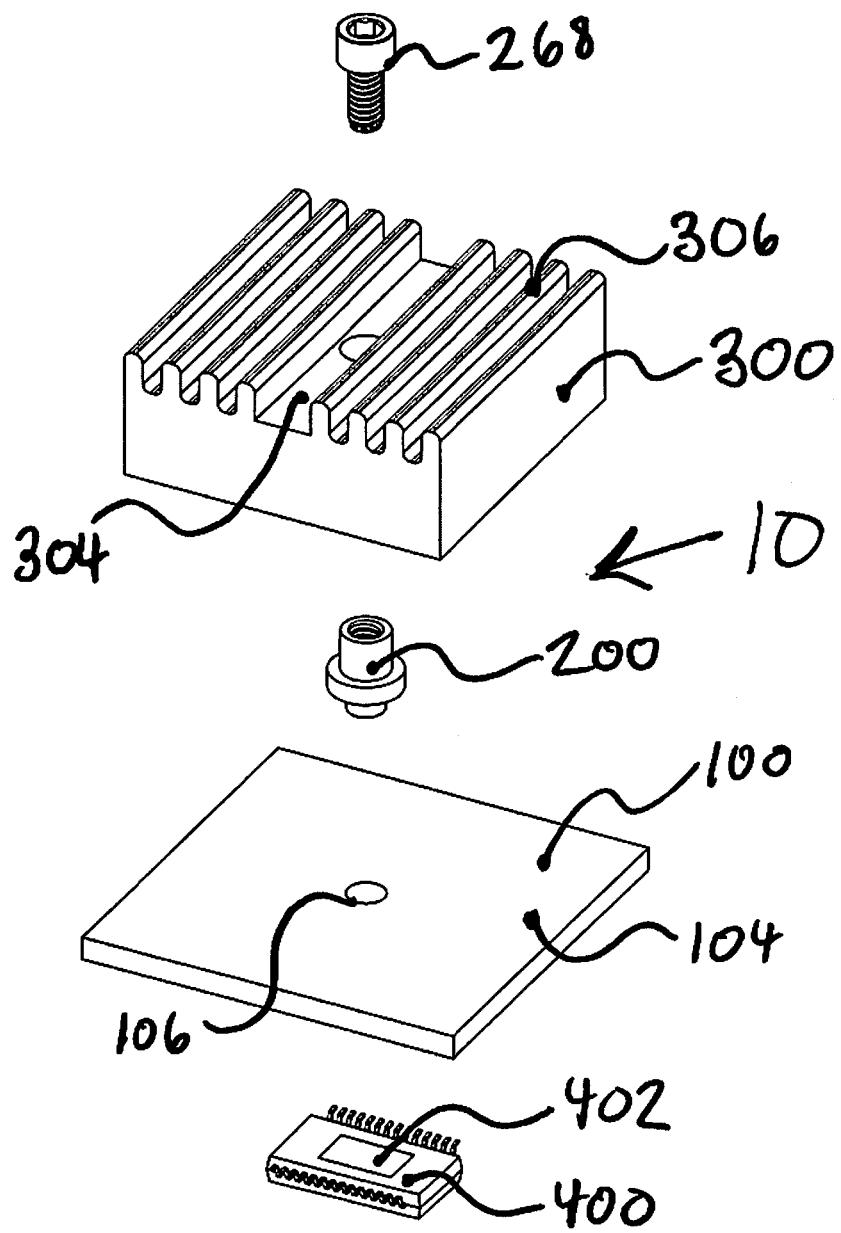
Figure 2A:
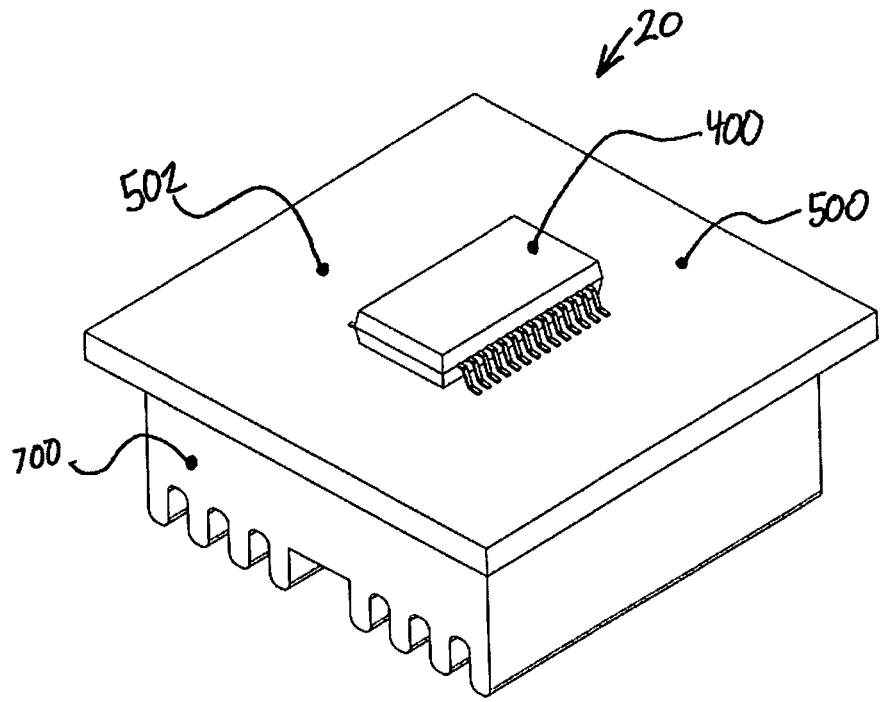
FIG. 2A is a perspective view of a thermal dissipation system according to another embodiment of the present disclosure.
Figure 2B:
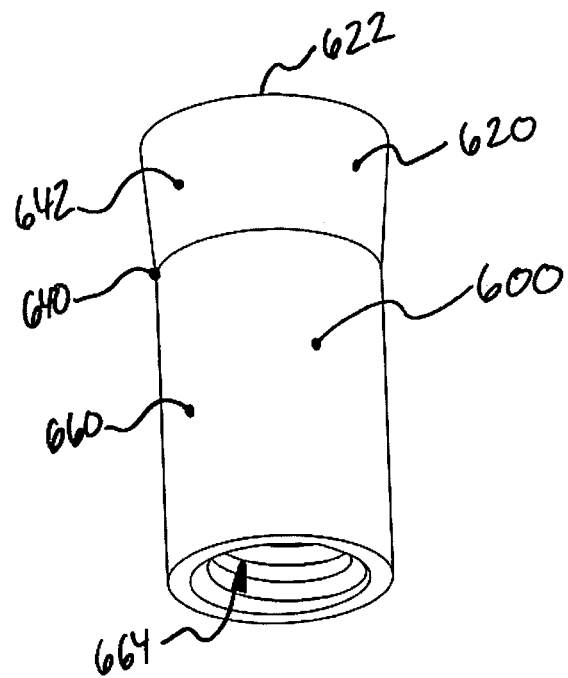
FIGS. 2B-2C are perspective views of a thermal connector of the thermal dissipation system of FIG. 2A.
Figure 2C:
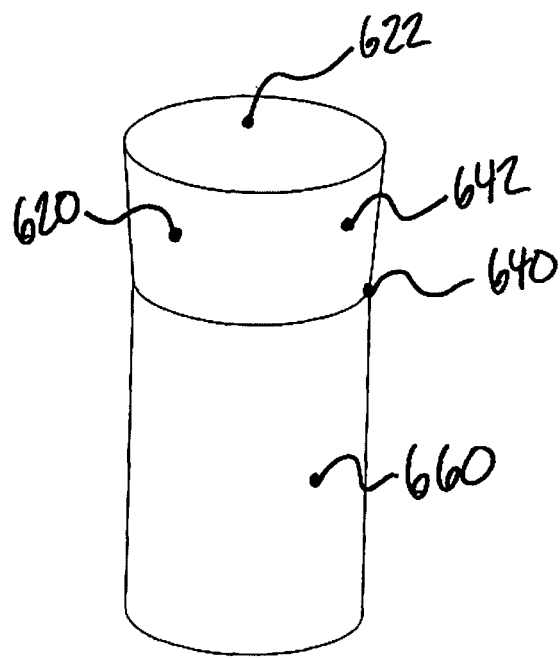
Figure 2D:
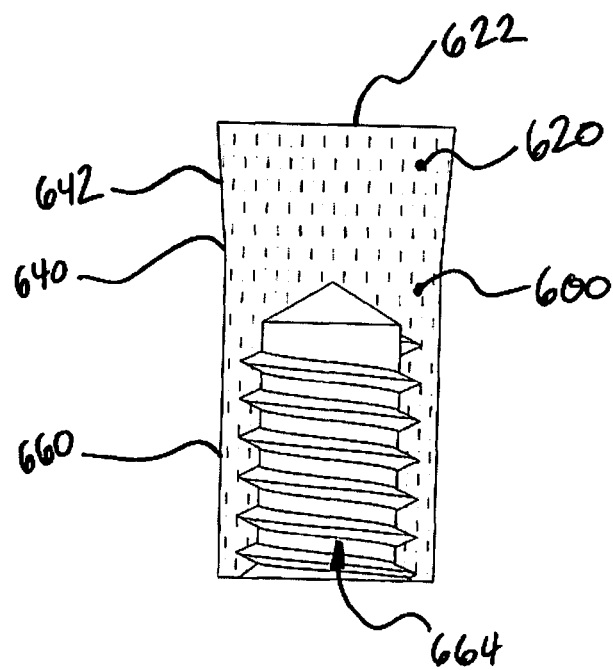
FIG. 2D is a cross-sectional view of the thermal connector of FIG. 2B.
Figure 2E:
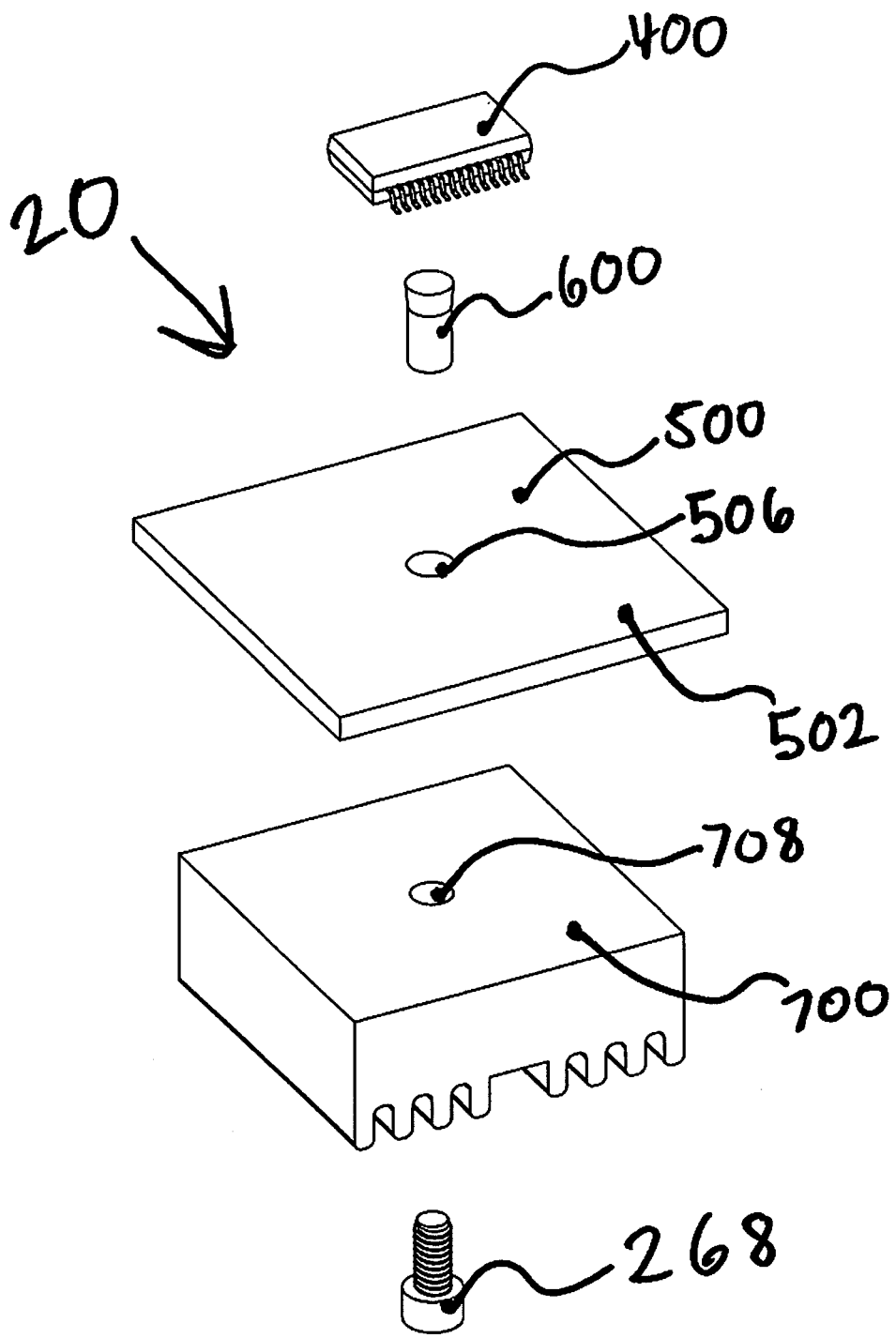
FIGS. 2E and 2F are perspective views of the thermal dissipation system of FIG. 2A, with the components separated.
Figure 2F:
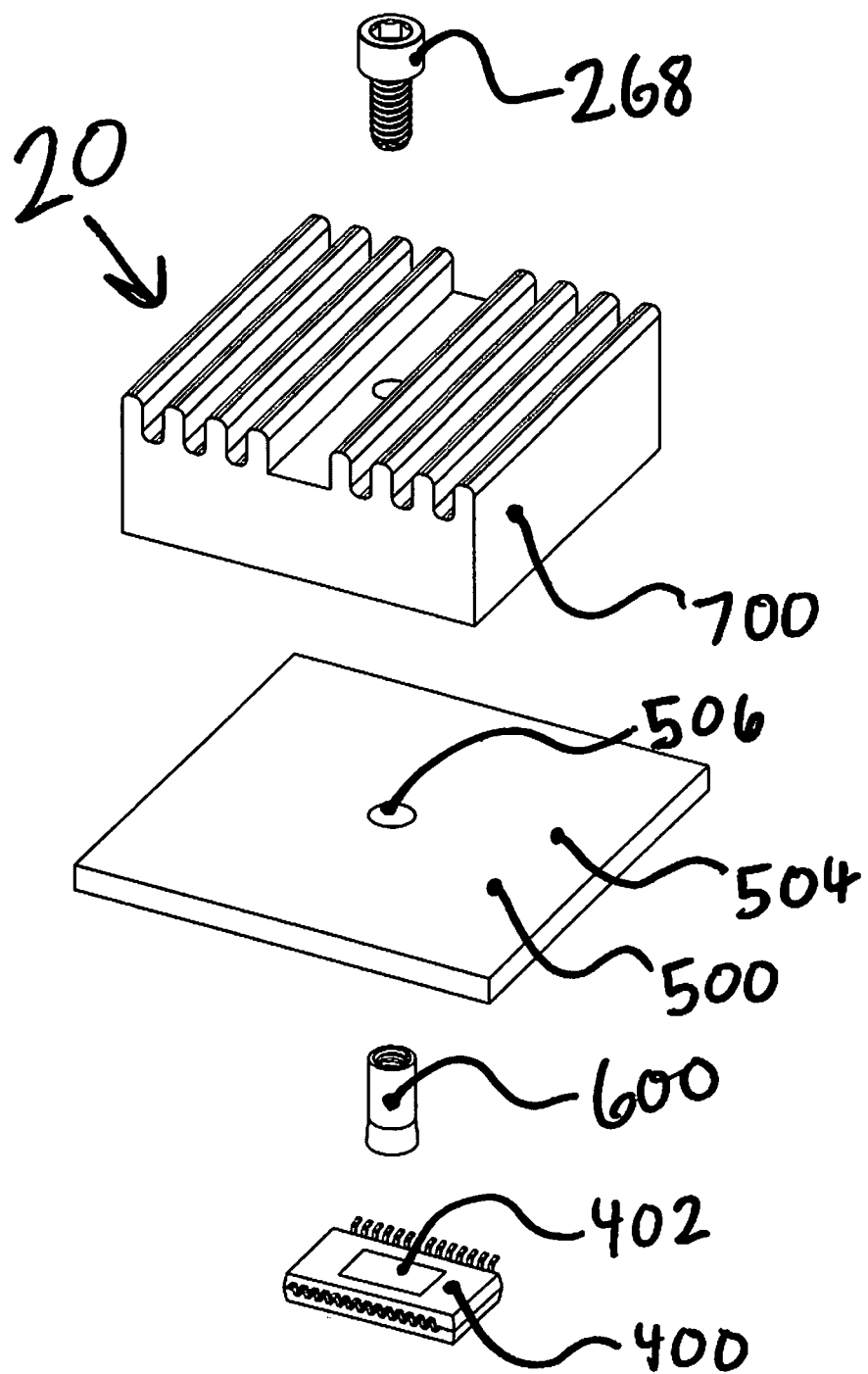
Figure 2G:
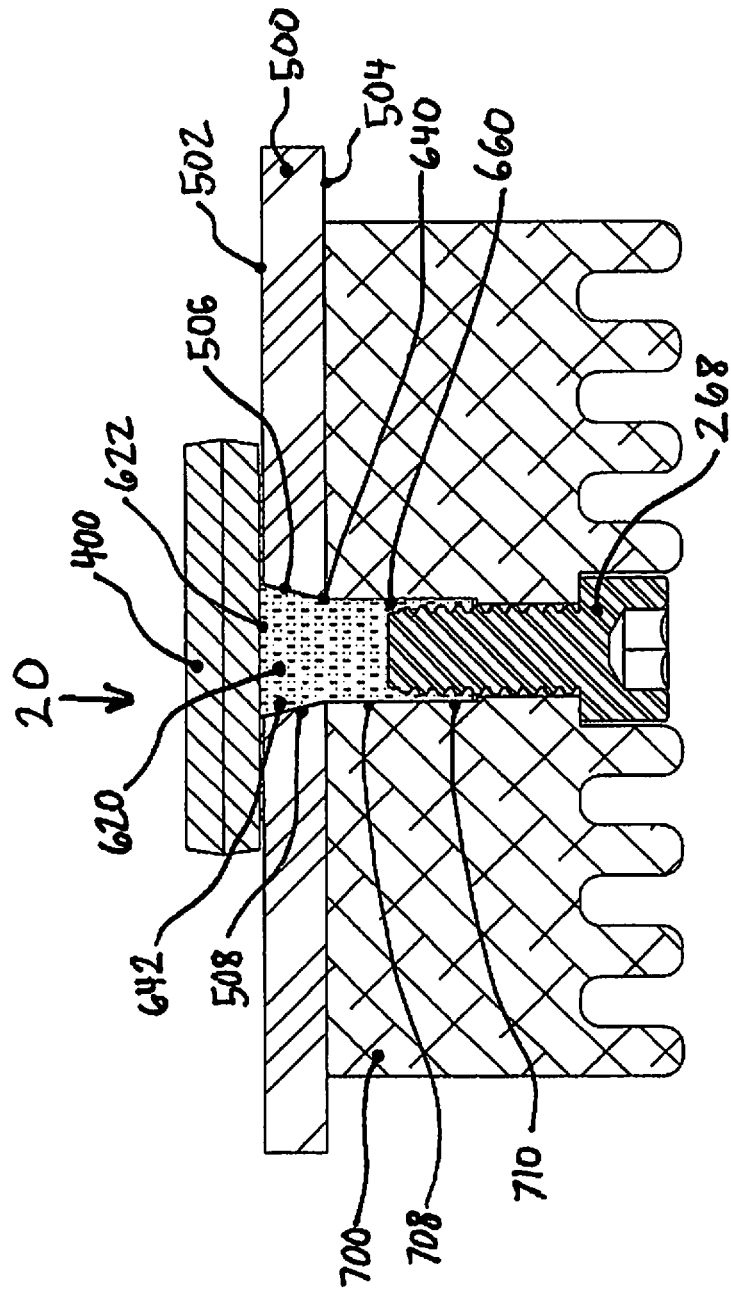
FIG. 2G. is a side, cross-sectional view of the thermal dissipation system of FIG. 2A.
Figure 3A:
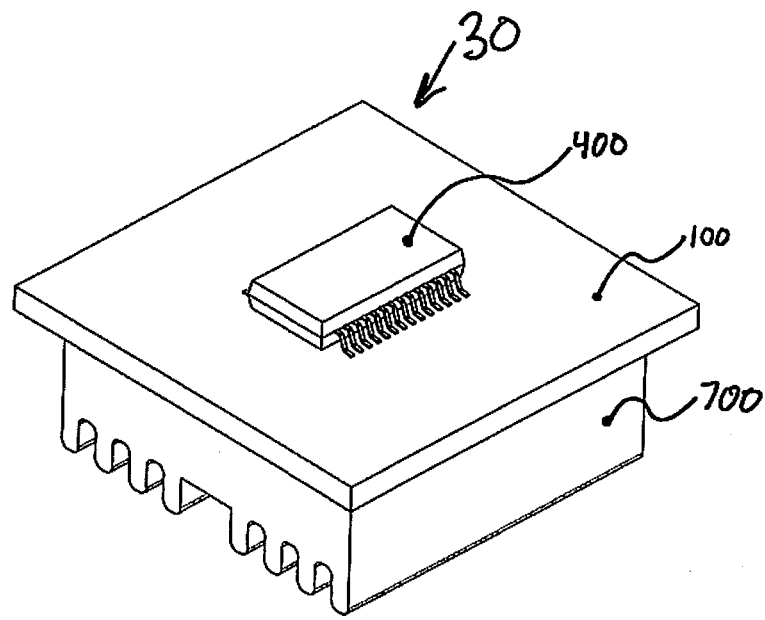
FIG. 3A is a perspective view of a thermal dissipation system according to another embodiment of the present disclosure.
Figure 3B:
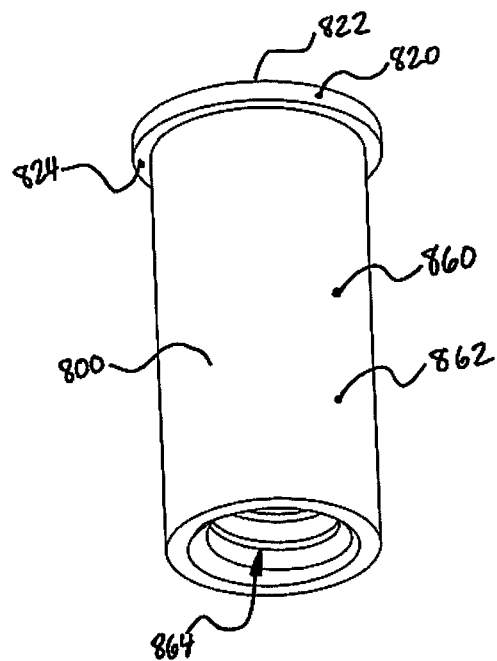
FIGS. 3B-3C are perspective views of a thermal connector of the thermal dissipation system of FIG. 3A.
Figure 3C:
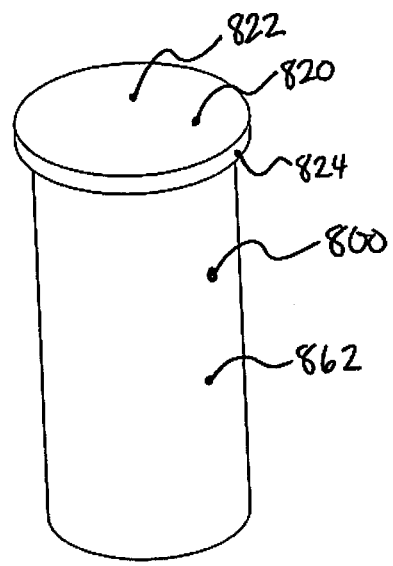
Figure 3D:
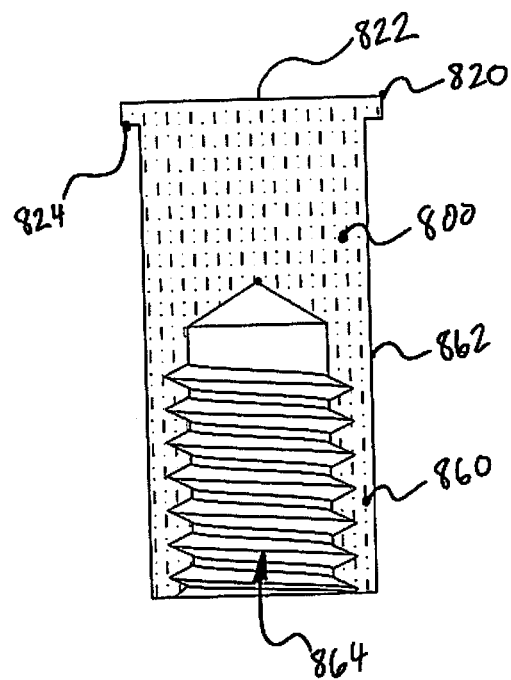
FIG. 3D is a cross-sectional view of the thermal connector of FIG. 3B.
Figure 3E:
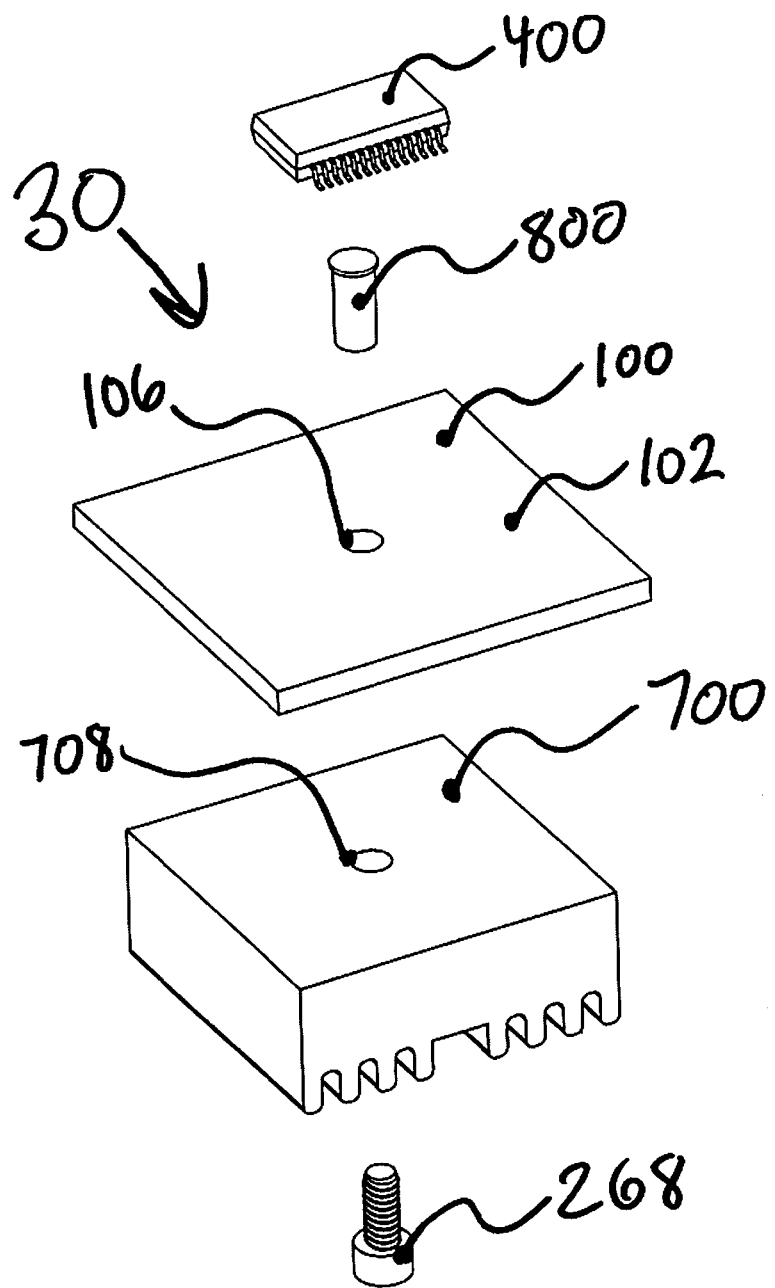
FIGS. 3E and 3F are perspective views of the thermal dissipation system of FIG. 3A, with the components separated.
Figure 3F:
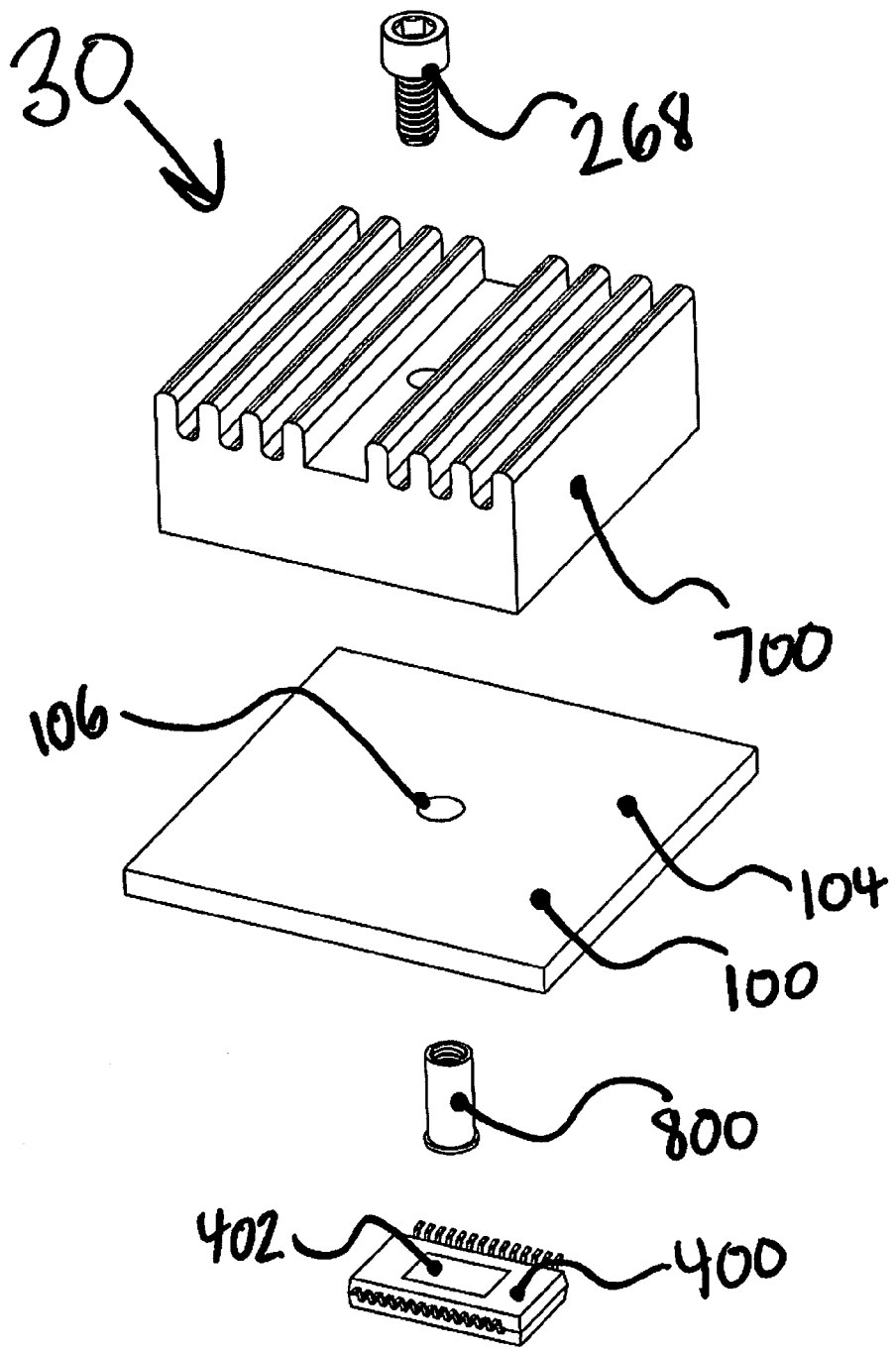
Figure 3G:
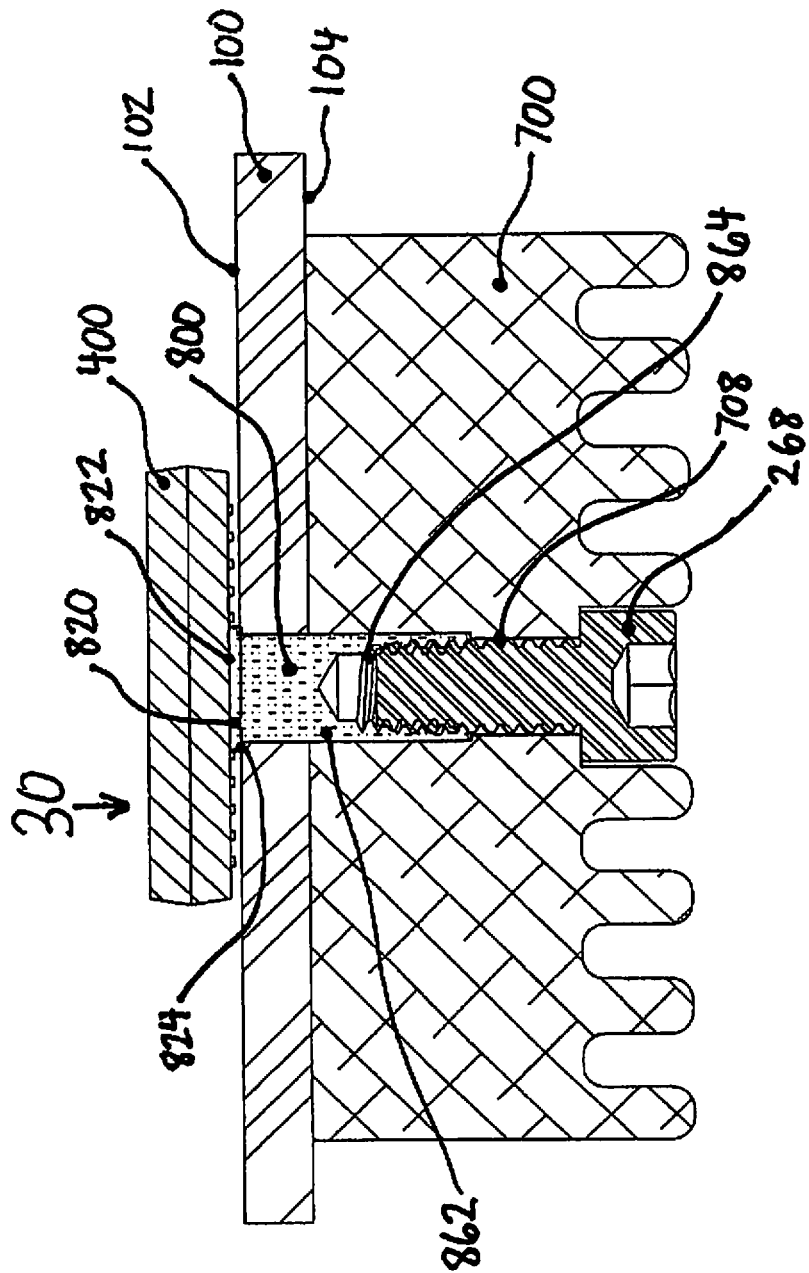
FIG. 3G. is a side, cross-sectional view of the thermal dissipation system of FIG. 3A.
Figure 4A:
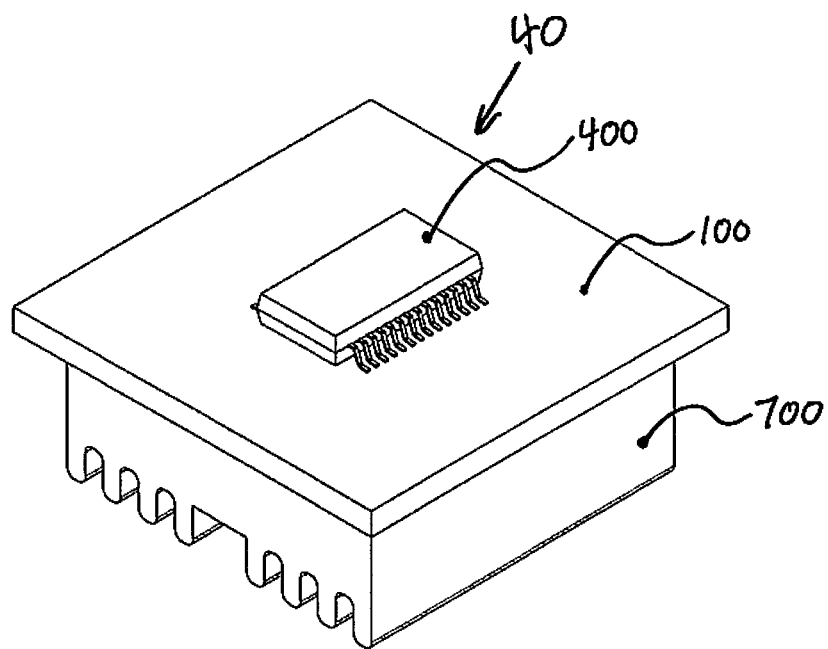
FIG. 4A is a perspective view of a thermal dissipation system according to another embodiment of the present disclosure.
Figure 4B:
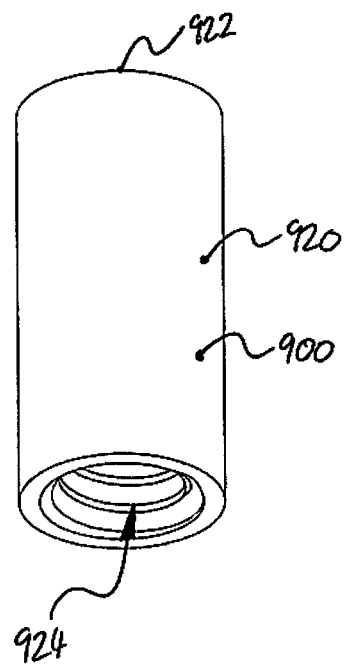
FIGS. 4B-4C are perspective views of a thermal connector of the thermal dissipation system of FIG. 4A.
Figure 4C:
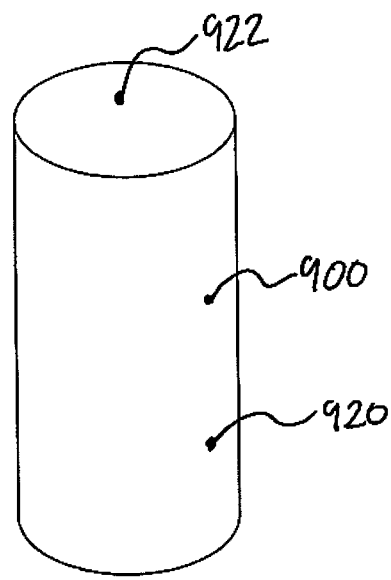
Figure 4D:
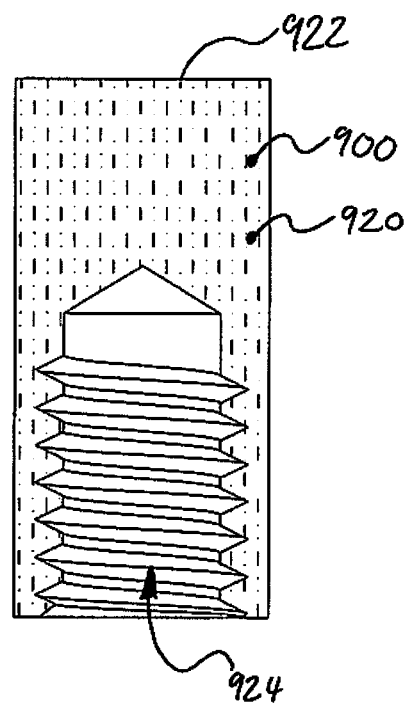
FIG. 4D is a cross-sectional view of the thermal connector of FIG. 4B.
Figure 4E:
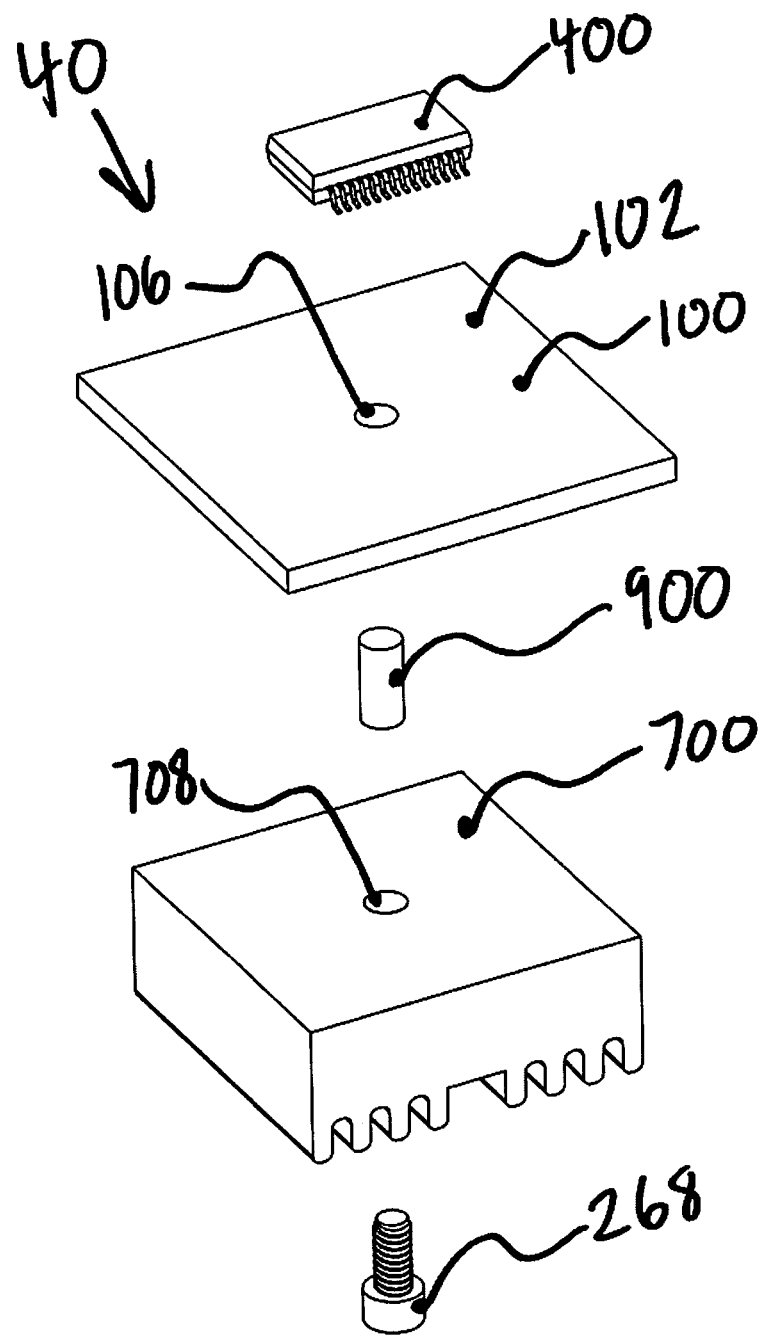
FIGS. 4E and 4F are perspective views of the thermal dissipation system of FIG. 4A, with the components separated.
Figure 4F:
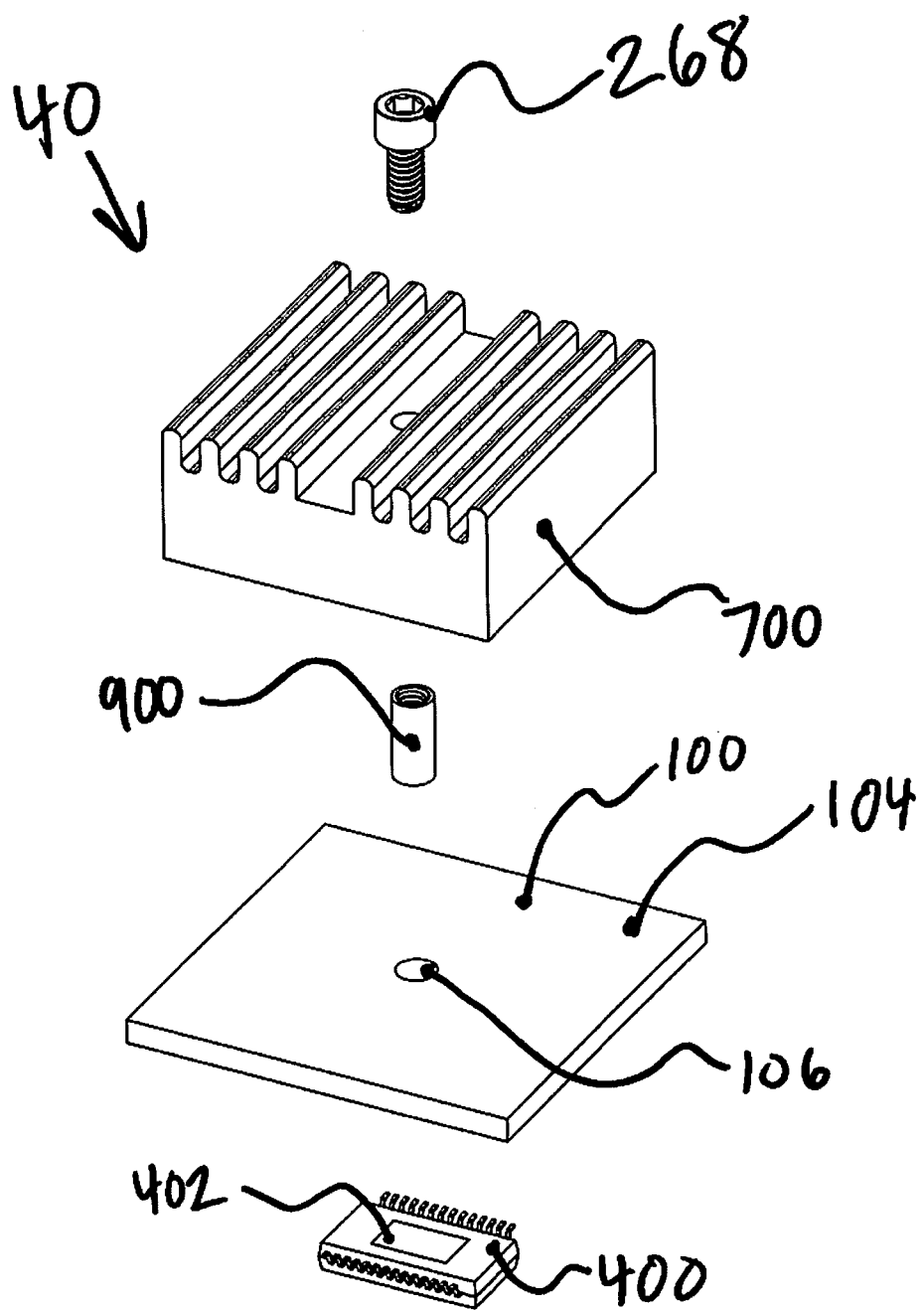
Figure 4G:
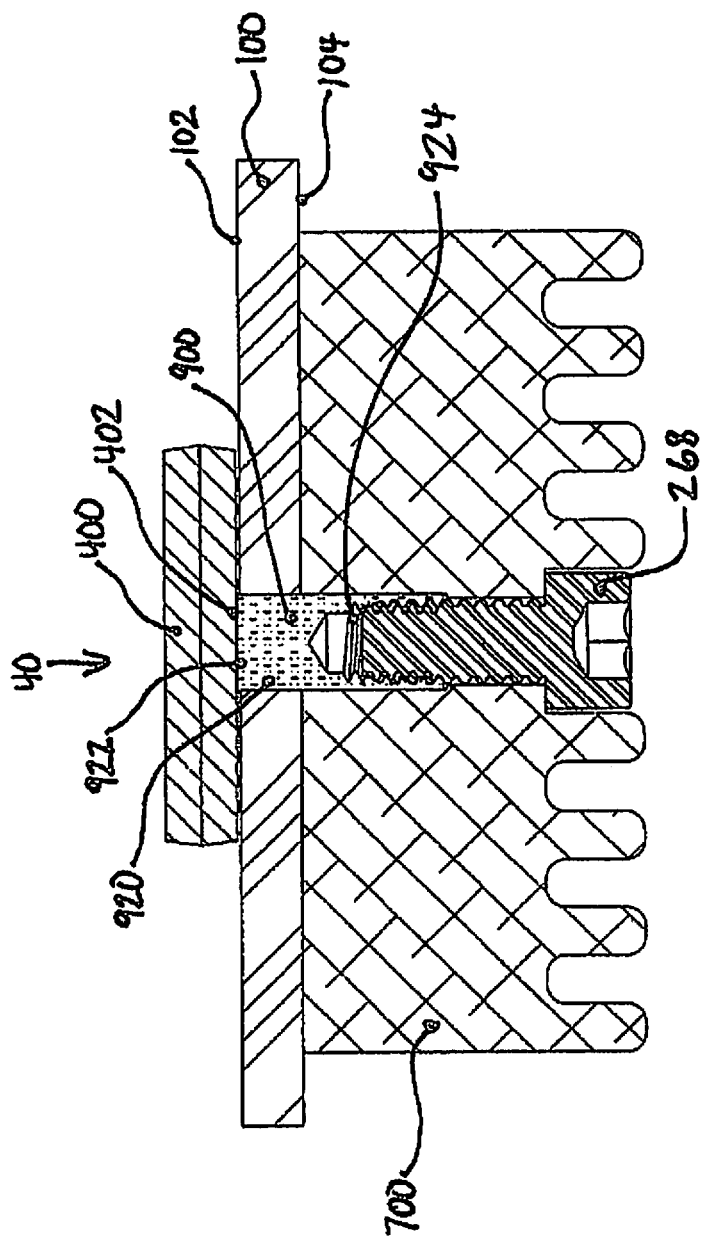
FIG. 4G. is a side, cross-sectional view of the thermal dissipation system of FIG. 4A.
Figure 5A:
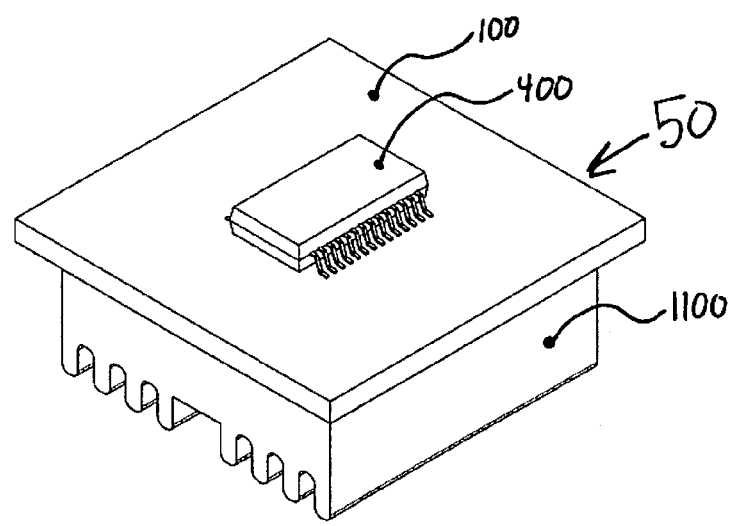
FIG. 5A is a perspective view of a thermal dissipation system according to another embodiment of the present disclosure.
Figure 5B:
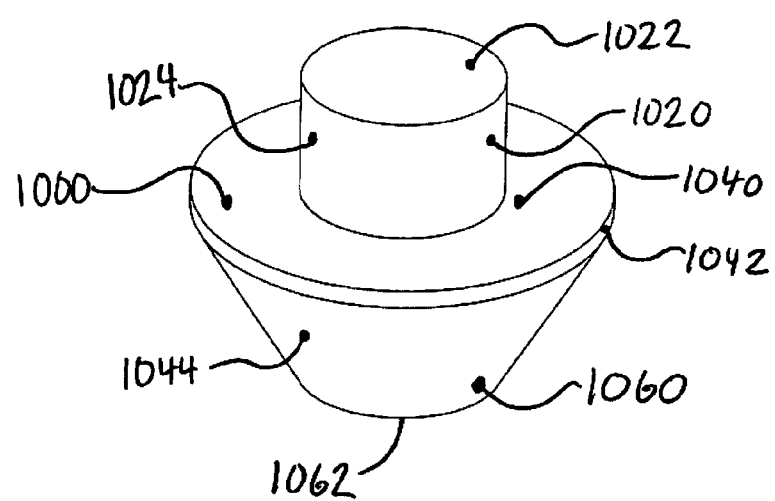
FIGS. 5B-5C are perspective views of a thermal connector of the thermal dissipation system of FIG. 5A.
Figure 5C:
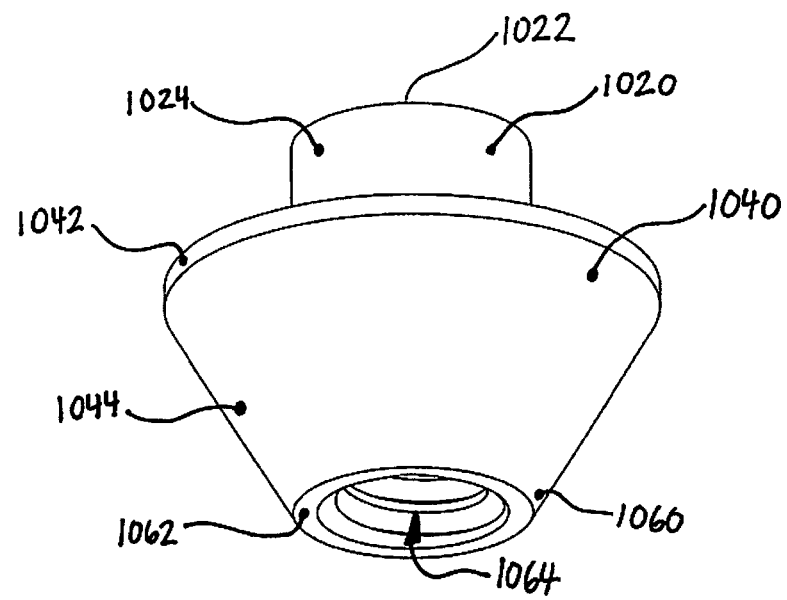
Figure 5D:
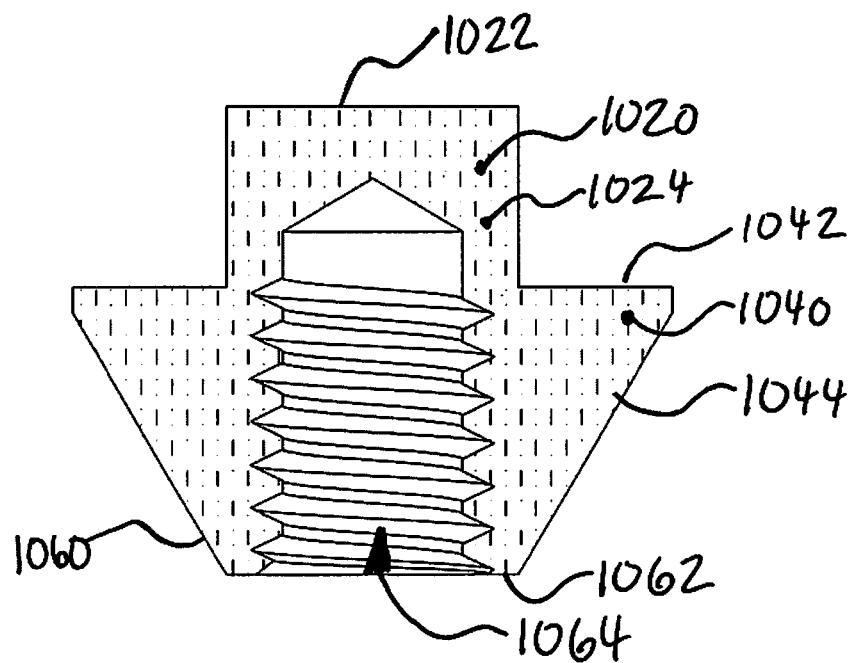
FIG. 5D is across-sectional view of the thermal connector of FIG. 5B.
Figure 5E:
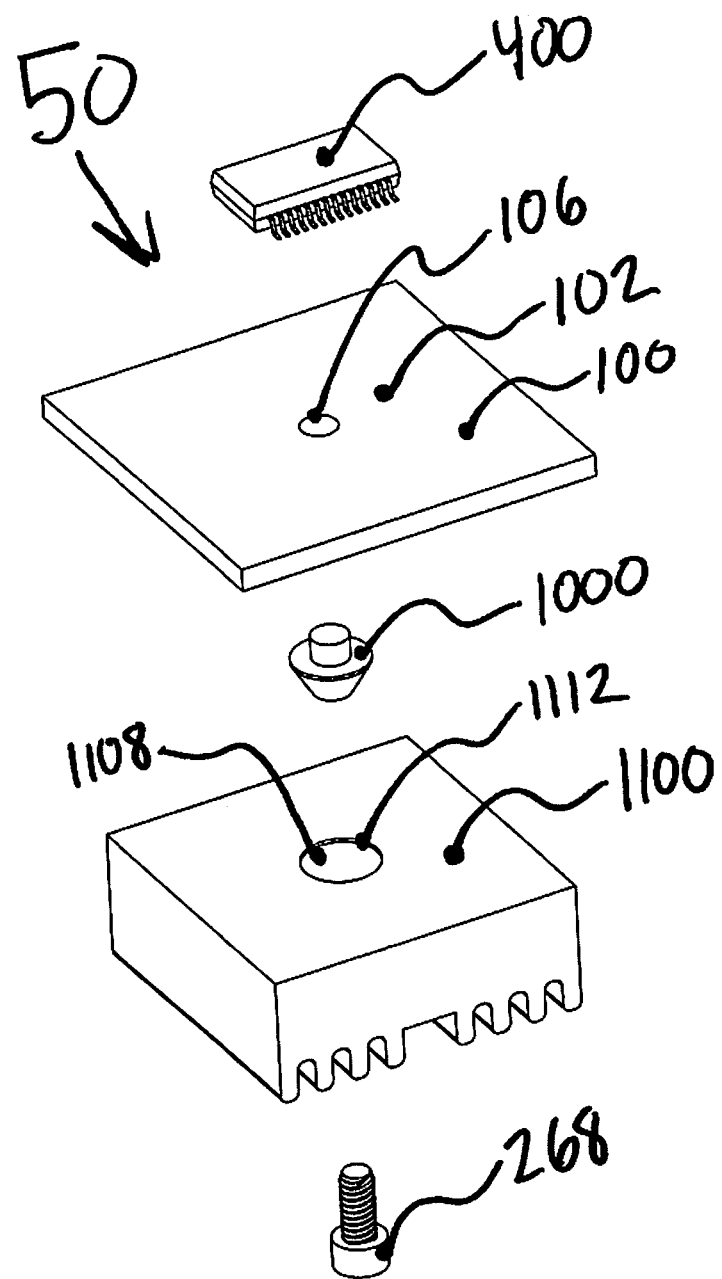
FIGS. 5E and 5F are perspective views of the thermal dissipation system of FIG. 5A, with the components separated.
Figure 5F:
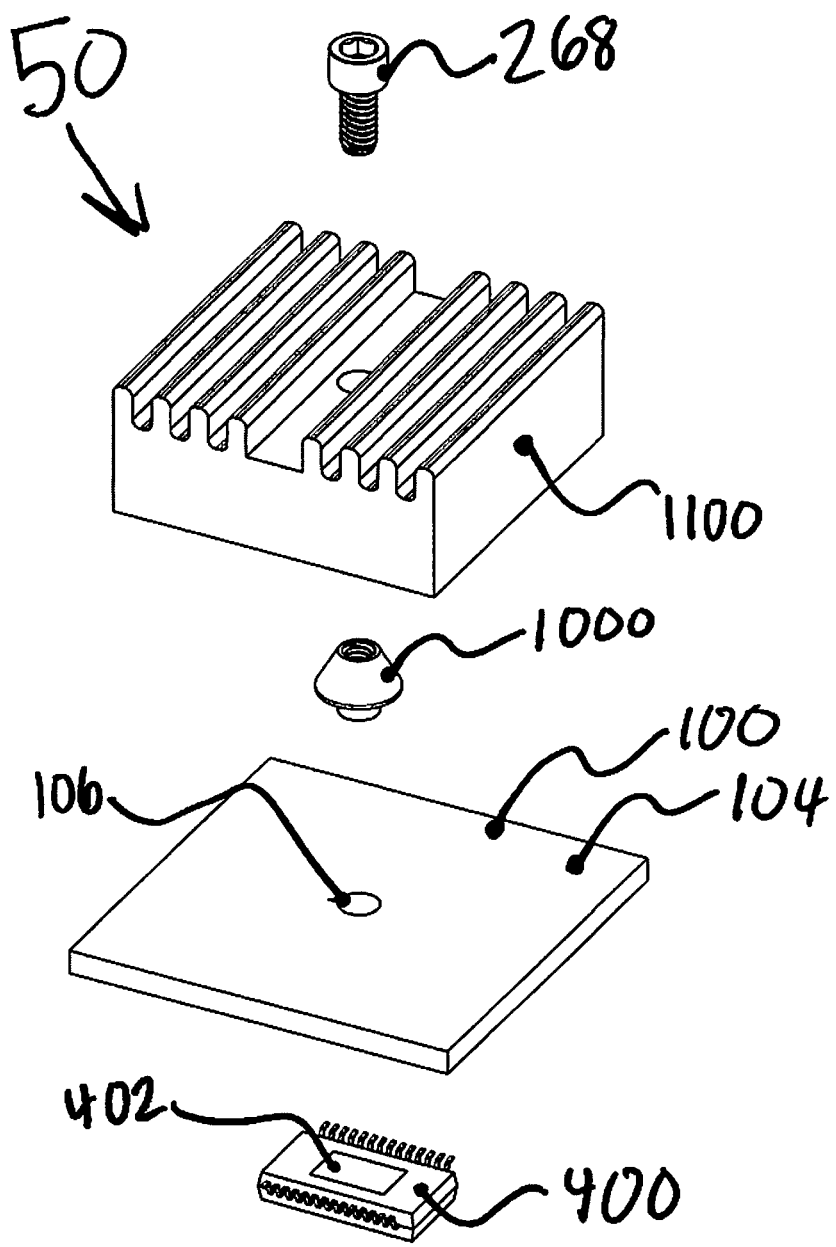
Figure 5G:
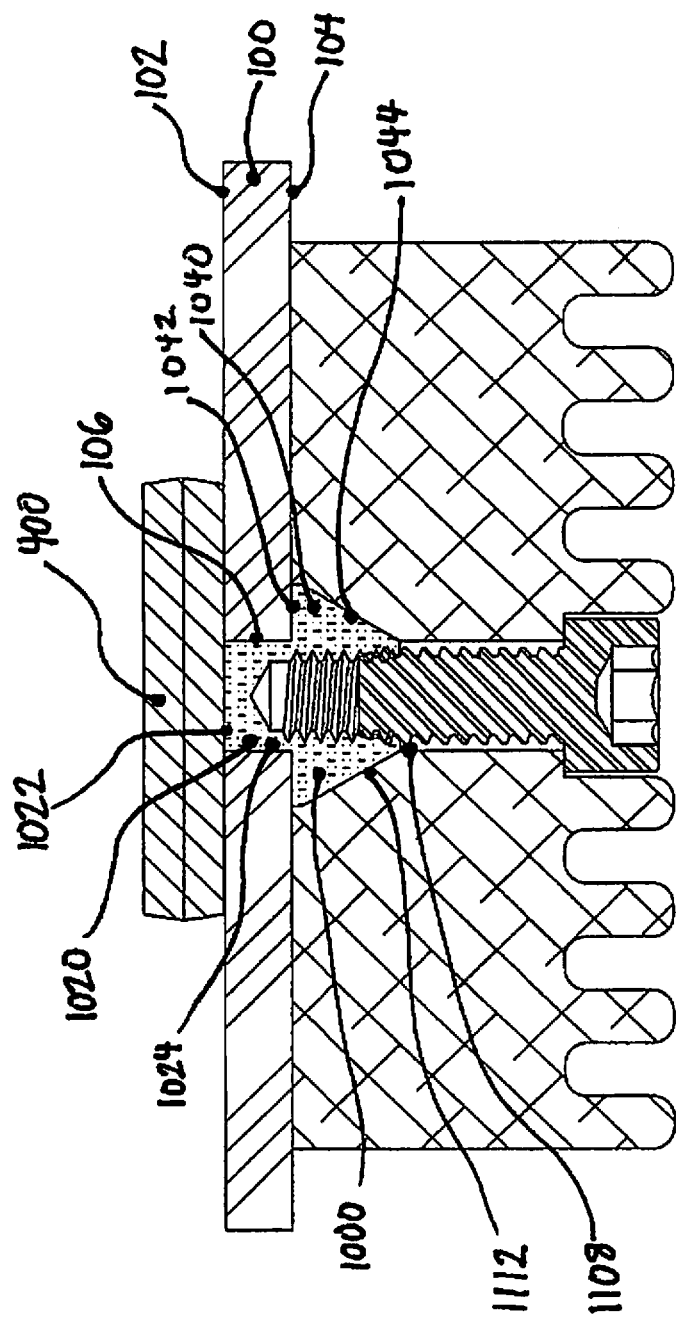
FIG. 5G. is a side, cross-sectional view of the thermal dissipation system of FIG. 5A.

Referring now to FIGS. 1E and 1F, radiator 300 includes a top surface 302, a bottom surface 304 and a plurality of dissipating vanes 306 extending from bottom surface 304 and configured for dissipating thermal energy into the surrounding air or into a thermal reservoir such as, for example, a water cooling system or large metallic object.

A receptacle 308 extends through radiator 300 from top surface 302 to bottom surface 304 and is configured and dimensioned to receive at least a portion of thermal connector 200 therein such that thermal connector 200 is disposed in thermal communication with radiator 300. Receptacle 308 includes a central shaft 310 and a shelf 312. Shelf 312 is recessed relative to top surface 302 and defines a bottom wall 314 and a side wall 316. Shelf 312 is configured and dimensioned to receive flange 242 therein when thermal connector 200 is inserted into receptacle 308. Side wall 316 defines a diameter that is slightly larger than the diameter "D2" of the middle segment 240 such that the gap between side wall 316 and the side surface 248 of middle segment 240 is as small as possible to maximize the thermal transfer characteristics between middle segment and shelf 312. Flange 242 may alternatively be received directly against top surface 302 of radiator 300 such that bottom surface 246 of thermal connector 200 is disposed in thermal communication with the top surface 302 of radiator 300.

Central shaft 310 is configured for the reception of bottom segment 260 therein when thermal connector 200 is inserted into receptacle 308. Central shaft 310 defines a diameter that slightly larger than the third diameter "D3" of the bottom segment 260 such that the gap between central shaft 308 and bottom segment 260 is minimized to promote improved thermal transfer characteristics between central shaft 308 and bottom segment 260.

Referring now to FIGS. 1E-1G, screw 268 includes a head 270 and a threaded portion 272. Head 270 of screw 268 is configured to engage bottom surface 304 of radiator 300 when the threaded portion 272 is inserted into the threaded bore 264 of thermal connector 200. As screw 268 is tightened, shelf 312 is driven against bottom surface 246 of flange 242 to secure radiator 300 to thermal connector 200 and to reduce the gap distance between the shelf 312 of radiator 300 and the flange 242 of thermal connector 200. Reduced gap distances provide improved thermal transfer characteristics between thermal connector 200 and radiator 300. For example, it is contemplated that the thermal resistance between the contact surfaces of thermal connector 200, e.g., side surface 248 and bottom surface 246 of flange 242 and bottom segment 260, and the contact surfaces of radiator 300, e.g., bottom and side walls 314, 316 of shelf 312 and central shaft 310 of receptacle 308 are less than or equal to the thermal resistance between top surface 222 of top segment 220 and the surface mount component 400.

With reference now to FIGS. 1E-1G, the assembly of thermal dissipation system 10 will now be described. During assembly, the thermal connector 200 is inserted into the opening 106 of PCB 100 such that the top surface 244 of flange 242 engages the bottom surface 104 of PCB 100 with the top surface 222 of top segment 220 aligned with or slightly raised above top surface 102 of PCB 100. It is contemplated that top surface 222 of top segment 220 may alternatively be slightly below the top surface 102 of PCB 100. The surface mount component 400 is then installed on top of the thermal connector 200 such that the die pad 402 is disposed over and in contact with top surface 222 of top segment 220. Solder or other thermal medium may be applied to thermal connector 200 prior to insertion through opening 106 or prior to installation of surface mount component 400. PCB 100 may be heated, e.g., in a reflow solder oven, to allow the solder to flow and may be cooled to solidify the solder to thermally connect and secure the thermal connector 200 to surface mount component 400 and PCB 100. In the case where top surface 222 of top segment 220 is below the top surface 102 of PCB 100, solder may be used to fill the gap between top surface 222 and surface mount component 400. It is contemplated that thermal connector 200 may alternatively be soldered to PCB 100 prior to the installation of surface mount component 400.

Once thermal connector 200 is secured to the PCB 100 and surface mount component 400, radiator 300 may be positioned against or adjacent to PCB 100 such that the flange 242 of middle segment 240 is received within shelf 312 of receptacle 308 and the bottom segment 260 of the thermal connector 200 is received within central shaft 310 of receptacle 308. Screw 268 is then inserted through central shaft 310 with threaded portion 272 inserted into the threaded bore 264 of thermal connector 200 and tightened until radiator 300 is firmly secured to thermal connector 200 with the bottom wall 314 of shelf 312 engaging the bottom surface 246 of flange 242.

It is contemplated that additional thermal connectors 200 may be inserted through PCB 100 to engage additional surface mount components 400 and that each thermal connector 200 may have a corresponding radiator 300. Alternatively, it is contemplated that a single radiator 300 may be utilized for one or more thermal connectors 200 such that each thermal connector 200 is secured to a corresponding receptacle 308 of radiator 300.

Referring now to FIGS. 2A-2G, a thermal dissipation system in accordance with another embodiment of the present disclosure is shown and generally designated 20. Thermal dissipation system 20 includes a printed circuit board (PCB) 500, a thermal connector 600, a dissipater or radiator 700 and at least one surface mount component 400, similar to thermal dissipation system 10. For brevity, only the differences between thermal dissipation system 20 and thermal dissipation system 10 will be described herein.

PCB 500 includes a top surface 502 configured for mounting the at least one surface mount component 400 thereon, and a bottom surface 504 opposite top surface 502. Each surface mount component 400 is configured to be mounted over an opening 506 extending through PCB 500 from the top surface 502 to the bottom surface 504 such that the die pad 402 of the surface mount component 400 is substantially aligned with the opening 506. The opening 506 defines a taper 508 (FIG. 2G) from top surface 502 to bottom surface 504.

Thermal connector 600 includes a top segment 620, a middle segment 640 and a bottom segment 660. Top segment 620 includes a top surface 622 for engagement with surface mount component 400. Thermal connector 600 defines a tapered portion 642 from top surface 622 to middle segment 640 corresponding to the taper 508 of the opening 506 of the PCB 500. Bottom segment 660 is substantially similar to bottom segment 260 of thermal connector 200 and includes a threaded bore 664 similar to bottom segment 260 of thermal connector 200.

Radiator 700 is similar to radiator 300 but includes a receptacle 708 extending therethrough including a central shaft 710 having substantially the same diameter along its length. The diameter of central shaft 710 is slightly larger than the bottom segment 660 of thermal connector 600 to receive bottom segment 660 therein.

During assembly of thermal dissipation system 20, thermal connector 600 is inserted through top surface 502 of PCB 500 such that the tapered portion 642 seats into opening 506. Surface mount component 400 is then installed over opening 506 and top surface 622 of thermal connector 600. It is contemplated that the thermal connection between thermal connector 600 and the die pad 402 of surface mount component 400 may be solderless. Alternatively, thermal connector 600 may include a solder or another thermal communication medium on top surface 622 for securing and thermally connecting thermal connector 600 to surface mount component 400 and PCB 500. Radiator 700 is secured to thermal connector 600 by insertion of screw 268 through receptacle 708 to engage threaded bore 664, similar to the assembly of thermal dissipation system 10 as described above.

Referring now to FIGS. 3A-3G, a thermal dissipation system in accordance with another embodiment of the present disclosure is shown and generally designated 30. Thermal dissipation system 30 includes a printed circuit board (PCB) 100, a thermal connector 800, a dissipater or radiator 700, and at least one surface mount component 400, similar to thermal dissipation systems 10 and 20. For brevity, only the differences between thermal dissipation system 30 and thermal dissipation system 10 and 20 will be described herein.

Thermal connector 800 includes a top segment 820, and a bottom segment 860 extending from top segment 820 and defining a cylindrical portion 862 having a threaded bore 864 similar to bottom segment 260 of thermal connector 200. Top segment 820 includes a top surface 822 for engagement with surface mount component 400 including a lip 824 extending radially beyond the cylindrical portion 862.

During assembly of thermal dissipation system 30, thermal connector 800 is inserted into opening 106 of top surface 102 of PCB 100 such that lip 824 abuts or seats on top surface 102. Surface mount component 400 is installed over opening 106 and top surface 822 of thermal connector 800. It is contemplated that the thermal connection between thermal connector 800 and the die pad 402 of surface mount component 400 may be solderless. Alternatively, thermal connector 800 may include a solder or another thermal communication medium on top surface 822 for securing and thermally connecting thermal connector 800 to surface mount component 400 and PCB 100. Radiator 700 is secured to thermal connector 800 by insertion of screw 268 through receptacle 708 to engage threaded bore 864, similar to the assembly of thermal dissipation systems 10 and 20 as described above.

Referring now to FIGS. 4A-4G, a thermal dissipation system in accordance with another embodiment of the present disclosure is shown and generally designated 40. Thermal dissipation system 40 includes a printed circuit board (PCB) 100, a thermal connector 900, a dissipater or radiator 700, and at least one surface mount component 400, similar to thermal dissipation systems 10, 20 and 30. For brevity, only the differences between thermal dissipation system 40 and thermal dissipation system 10, 20 and 30 will be described herein.

Thermal connector 900 includes a single segment 920 defining a substantially cylindrical shape and including a threaded bore 924 similar to bottom segment 260 of thermal connector 200. Segment 920 includes a top surface 922 for engagement with surface mount component 400. By using a simple cylindrical shape, thermal connector 900 may be inserted through opening 106 in PCB 100 from either the top surface 102 or the bottom surface 104.

During assembly of thermal dissipation system 40, thermal connector 900 is inserted into opening 106 from either the top surface 102 or the bottom surface 104 of PCB 100. Surface mount component 400 is installed over opening 106 and secured in place. Thermal connector 900 may be inserted prior to or after surface mount component 400 is secured to PCB 100. For example, once surface mount component 400 is secured in place, thermal connector 900 may be inserted into opening 106 through bottom surface 104 of PCB 100 and top surface 922 may be engaged with or positioned in contact with the die pad 402 of the surface mount component 400 to provide a thermal connection. It is contemplated that the thermal connection between thermal connector 900 and the die pad 402 of surface mount component 400 may be solderless. Alternatively, solder or another thermal transfer material may be applied to thermal connector 900 or die pad 402 prior to insertion of thermal connector through opening 106. Radiator 700 is secured to thermal connector 900 by insertion of screw 268 through receptacle 708 to engage threaded bore 924, similar to the assembly of thermal dissipation systems 10, 20, and 30 as described above.

Referring now to FIGS. 5A-5G, a thermal dissipation system in accordance with another embodiment of the present disclosure is shown and generally designated 50. Thermal dissipation system 50 includes a printed circuit board (PCB) 100, a thermal connector 1000, a dissipater or radiator 1100, and at least one surface mount component 400, similar to thermal dissipation systems 10, 20, 30 and 40. For brevity, only the differences between thermal dissipation system 50 and thermal dissipation system 10, 20, 30 and 40 will be described herein.

Thermal connector 1000 includes a top segment 1020, and a middle segment 1040 and a bottom segment 1060. Top segment 1020 includes a top surface 1022 for engagement with surface mount component 400 and includes a cylindrical portion 1024 extending from top surface 1022 to middle segment 1040. Middle segment 1040 includes a flange 1042 extending radially from cylindrical portion 1024 and defines a taper 1044 from flange 1042 to a bottom surface 1062 of bottom segment 1060. It is contemplated that bottom surface 1062 has substantially the same diameter as cylindrical portion 1024 of top segment 1020. Bottom segment 1060 includes a threaded bore 1064 extending therein from bottom surface 1062 similar to bottom segment 260 of thermal connector 200.

Radiator 1100 is similar to radiator 300 and includes a receptacle 1108 having a tapered shelf 1112 and a cylindrical portion 1114 extending from the tapered shelf. Tapered shelf 1112 is dimensioned to receive the taper 1044 of flange 1042 therein. It is important to note that the use of thermal dissipation system 50 allows for improved manufacturing because tapered shelf 1112 may be easily fabricated through the use of a drill point countersink.

During assembly of thermal dissipation system 50, thermal connector 1000 is inserted into opening 106 through bottom surface 104 of PCB 100 such that flange 1042 abuts or engages bottom surface 104. Surface mount component 400 is installed over opening 106 and over the top surface 1022 of thermal connector 1000. It is contemplated that the thermal connection between thermal connector 1000 and the die pad 402 of surface mount component 400 may be solderless. Alternatively, solder may be applied to top surface 1022 of thermal connector 1000 to secure and thermally connect thermal connector 1000 to surface mount component 400 or PCB 100. Radiator 1100 is then positioned adjacent or proximal to PCB 100 such that the taper 1044 of the middle segment 1040 of thermal connector 1000 is received within the tapered shelf 1112 of radiator 1100. Radiator 1100 is then secured to thermal connector 1000 by insertion of screw 268 through receptacle 1108 to engage threaded bore 1064, similar to the assembly of thermal dissipation systems 10, 20, 30 and 40 as described above. As screw 268 is tightened, tapered shelf 1112 is pulled against taper 1044 of middle segment 1040 to maximize the thermal transfer characteristics between thermal connector 1000 and radiator 1100.

Figure 6A:
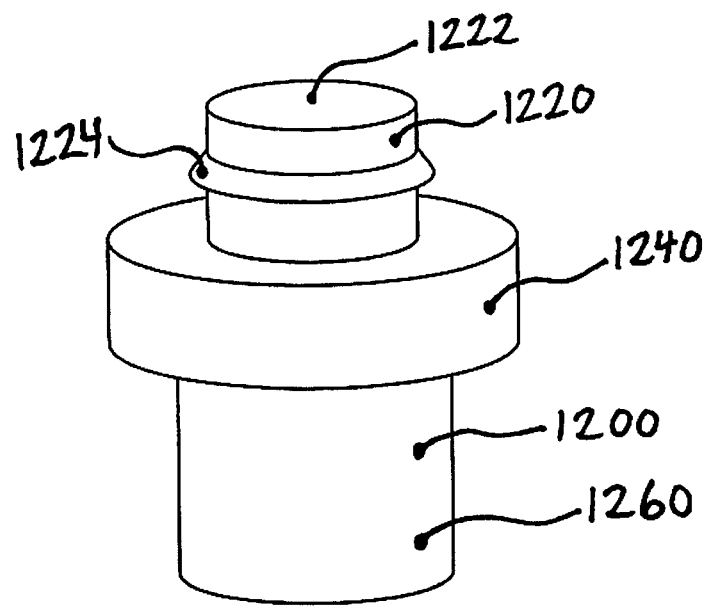
FIG. 6A is a perspective view of a thermal connector according to another embodiment of the present disclosure, illustrating a barbed ring around the top segment.
Figure 6B:
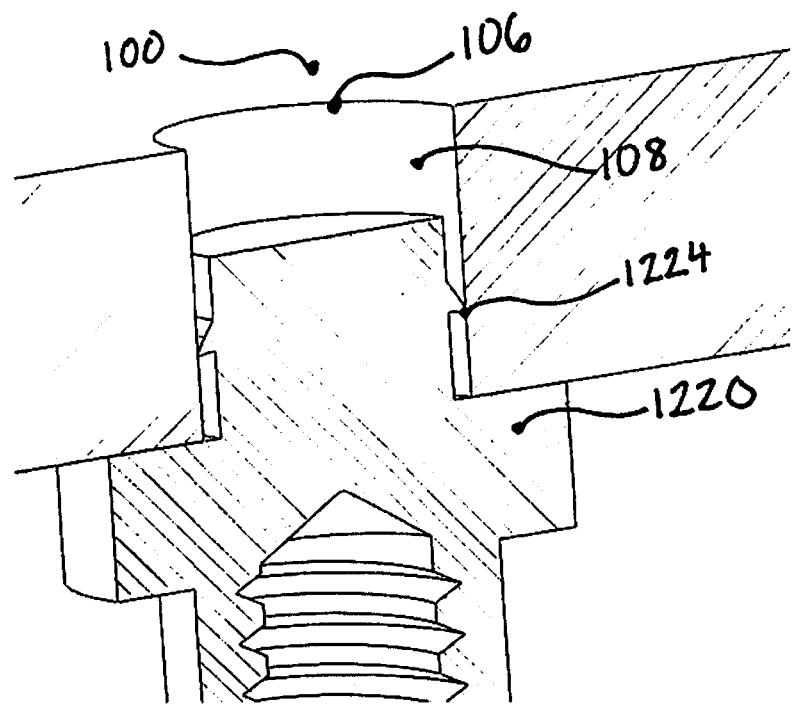
FIG. 6B is a perspective, cross-sectional view of the thermal connector of FIG. 6A.

Referring now to FIGS. 6A-6B, a thermal connector 1200 similar to thermal connectors 200, 600, 800, 900, and 1000 is disclosed. For brevity, only the differences between thermal connector 1200 and thermal connectors 200, 600, 800, 900, and 1000 will be described herein. Thermal connector 1200 includes a top segment 1220, a middle segment 1240 and a bottom segment 1260. Top segment 1220 is configured for insertion into the opening 106 of PCB 100 and includes a top surface 1222 and a barbed lip 1224. During assembly, as illustrated in FIG. 6B, barbed lip 1224 is configured bend or deform during insertion of thermal connector 1200 into the opening 106 of PCB 100 and to engage an inner surface 108 of the opening 106 to hold thermal connector 1200 within opening 106 in a friction fit. Barbed lip 1224 may assist in maintaining and securing thermal 1200 in place relative to PCB 100 during soldering, for example, when PCB 100 is passed through a reflow soldering system. Barbed lip 1224 may also inhibit solder from flowing through opening 106 in PCB 100 to bottom surface 104 to assure that a proper amount of solder remains on top surface 1222 and between thermal top segment 1220 and PCB 100. It is contemplated that barbed lip 1224 may be included on any of thermal connectors 200, 600, 800, 900 and 1000 to provide a friction fit with PCB's 100 and 500, respectively.

Figure 7:
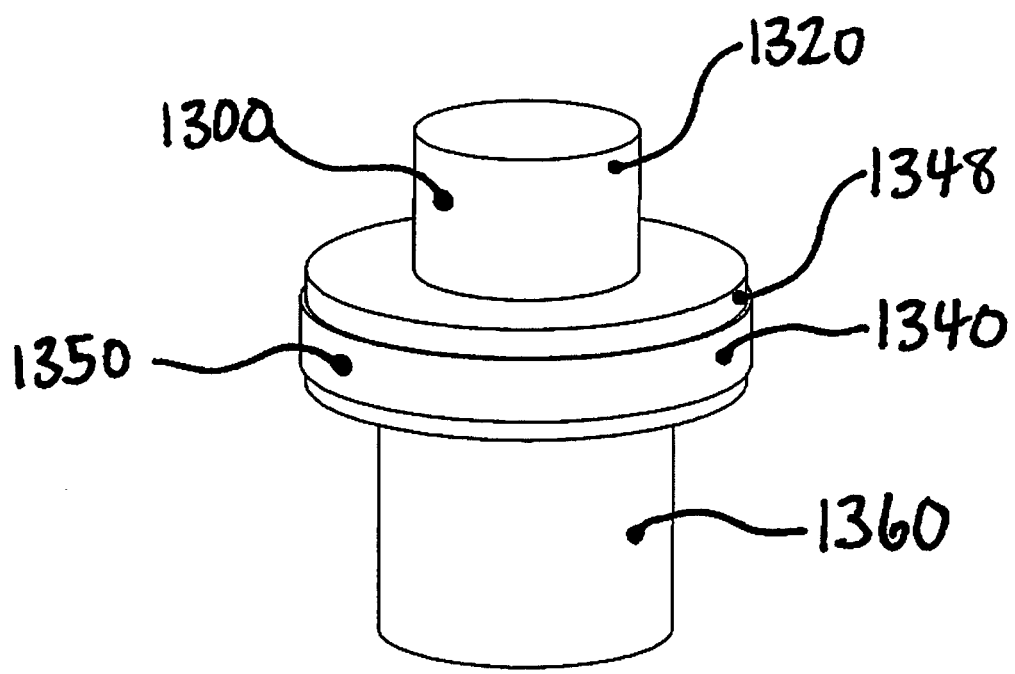
FIG. 7 is a perspective view of a thermal connector according to another embodiment of the present disclosure, illustrating a paint or lacquer ring around the middle segment.

Referring now to FIG. 7, a thermal connector 1300 similar to thermal connectors 200, 600, 800, 900, 1000, and 1200 is disclosed. For brevity, only the differences between thermal connector 1300 and thermal connectors 200, 600, 800, 900, 1000 and 1200 will be described herein. Thermal connector 1300 includes a top segment 1320, a middle segment 1340 and a bottom segment 1360 similar to thermal connector 200. In this embodiment, a paint or lacquer ring 1350 is applied, e.g., painted, circumferentially on side surface 1348 of middle segment 1340. Ring 1350 is configured to inhibit the flow of solder from middle segment 1340 to bottom segment 1360 during assembly. For example, during assembly, after thermal connector 1300 is inserted into the opening 106 of PCB 100 with solder applied to top surface 1322, PCB 100 is heated to the melting point of solder, e.g., in a reflow soldering oven. The solder will flow along top surface 1322 to middle segment 1340 up to the ring 1350 but will not flow past ring 1350 to bottom segment 1360. This allows thermal connector 1300 to be soldered to PCB 100 and a surface mount component 400 while inhibiting the solder from dripping onto the bottom segment 1360. This allows bottom segment 1360 to remain unobstructed such that bottom segment 1360 may be securely received within the receptacle 308 of radiator 300 when radiator 300 is secured to thermal connector 1300. It is contemplated that top segment 1320 or bottom segment 1360 may additionally or alternative include a paint or lacquer ring.

Referring now to FIGS. 8A-8D, a thermal dissipation system in accordance with another embodiment of the present disclosure is shown and generally designated 60. Thermal dissipation system 60 includes a printed circuit board (PCB) 1400, a thermal connector 200, a dissipater or radiator 1500, and at least one surface mount component 400, similar to thermal dissipation systems 10, 20, 30, 40 and 50. For brevity, only the differences between thermal dissipation system 60 and thermal dissipation system 10, 20, 30, 40 and 50 will be described herein.

In this embodiment, PCB 1400 includes a plurality of openings 1406 extending therethrough between first surface 1402 and second surface 1404 for the reception of a plurality of thermal connectors 200 therethrough. A plurality of surface mount components 400, for example, a light emitting diode 404 and a driver circuit 406, are installed over openings 1406 as described above for thermal dissipation system 10. It is contemplated that other additional or alternative surface mount components may be installed. Radiator 1500 is similar to radiator 300 except that radiator 1500 includes a plurality of receptacles 1508 for the reception of the plurality of thermal connectors 200. Similar to the assembly of radiator 300 of thermal dissipation system 10, radiator 1500 is secured to each thermal connector 200 by a screw 268. It is contemplated that PCB 1400 may include any number of openings 1406 for accommodating of any number of thermal connectors 200 therethrough where each opening 1406 may be aligned with and correspond to a surface mount component to be installed on PCB 1400. It is further contemplated that radiator 1500 may be attached to a single thermal connector 200 or may be attached to multiple thermal connectors 200 at the same time. For example, radiator 1500 may be the exclusive heat dissipation element for a single PCB 1400 with each surface mount component 400 installed on PCB 1400 being in thermal communication with radiator 1500 via thermal connectors 200.

Any of the above thermal connectors 200, 500, 800, 900, 1000, 1200 and 1300 may be fabricated from a thermally conductive material to provide a thermal pathway from the surface mount components 400 to the radiators 300, 700, 1100 and 1500 respectively. For example, thermal connectors 200, 500, 800, 900, 1000, 1200 and 1300 may be fabricated from copper, steel, brass, bronze, aluminum, gold, silver, other similarly conductive metals or materials, or various combinations thereof. It is also contemplated that any of the above thermal connectors may be plated with a conductive material. For example, in one embodiment, the thermal connector 200, 500, 800, 900, 1000, 1200 or 1300 may be gold plated. In another embodiment, thermal connector 200, 500, 800, 900, 1000, 1200 or 1300 may be silver plated. It is also contemplated that other metals or materials may be plated on thermal connectors 200, 500, 800, 900, 1000, 1200 or 1300 to provide enhanced thermal transfer or manufacturing characteristics.

Any of the above radiators 300, 700, 1100, and 1500 may be fabricated from thermally conductive materials to draw thermal energy from thermal connectors 200, 500, 800, 900, 1000, 1200 and 1300 and dissipate the thermal energy into the environment or a heatsink reservoir. For example, in one embodiment, radiators 300, 700, 1100, and 1500 are fabricated from aluminum. It is contemplated that radiators 300, 700, 1100, and 1500 may alternatively be fabricated from copper, steel, brass, bronze, aluminum, gold, silver, other similarly conductive metals or materials, or various combinations thereof.

The thermal dissipation system is designed to be easily integrated into common manufacturing techniques such as "pick and place robots" and "reflow" soldering. Each of the above thermal connectors are designed to have a minimal amount of mass.

It will be understood that various modifications may be made to the embodiments disclosed herein. Therefore, the above description should not be construed as limiting, but merely as exemplifications of preferred embodiments. Those skilled in the art will envision other modifications within the scope and spirit of the claims appended thereto.

The invention claimed is:

1. A thermal connector for use with a printed circuit board assembly, the thermal connector comprising:
 a top segment configured for insertion through an opening of a printed circuit board to thermally engage a heat source disposed on a top surface of the printed circuit board;

a middle segment extending from the top segment and including a flanged portion, the flanged portion configured to engage a bottom surface of the printed circuit board when the top segment is inserted through the opening of the printed circuit board; and a bottom segment extending from the middle segment, the bottom segment having a bore extending at least partially there through for receiving a fixation element therein for thermally engaging the bottom segment to a heat dissipating element.

2. The thermal connector according to claim 1, wherein the top segment includes a top surface configured for engagement with the heat source and the flanged portion of the middle segment includes a bottom surface configured for engagement with the heat dissipating element.

3. The thermal connector according to claim 2, wherein the surface area of the bottom surface of the flanged portion of the middle segment is greater than the surface area of the top surface of the top segment.

4. The thermal connector according to claim 2, wherein the surface area of the bottom surface of the flanged portion of the middle segment is substantially equal to the surface area of the top surface of the top segment.

5. The thermal connector according to claim 1, wherein the thermal connector is at least partially fabricated from at least one conductive material.

6. The thermal connector according to claim 5, wherein the thermal connector is plated with at least one of gold and silver.

7. The thermal connector according to claim 1, wherein the middle segment of the thermal connector includes a paint or a lacquer applied thereon, the paint or lacquer configured to inhibit the flow of solder thereacross.

8. The thermal connector according to claim 1, wherein the middle segment is configured for at least partial insertion into a receptacle of the heat dissipating element.

9. The thermal connector according to claim 1, wherein the heat source is a surface mount electrical component.

10. A thermal dissipation system for use with a printed circuit board assembly, the thermal dissipation system comprising:

a printed circuit board including a heat source disposed on a first surface thereof and an opening extending therethrough from the first surface to a second surface adjacent the heat source;

a thermal connector inserted through the opening of the printed circuit board to thermally engage at least one of the heat source and the printed circuit board in thermal communication, the thermal connector being configured to dissipate heat away from the at least one of the heat source and the printed circuit board;

a fixation element; and a heat dissipating element attached to the thermal connector by the fixation element, the heat dissipating element configured to dissipate heat received by the thermal connector from the at least one of the heat source and the printed circuit board.

11. The thermal dissipation system according to claim 10, wherein the heat source is a surface mount electrical component.

12. The thermal dissipation system according to claim 11, wherein the surface mount electrical component is a light emitting diode.

13. The thermal dissipation system according to claim 11, wherein the heat dissipating element is configured to attach to more than one thermal connector.

14. The thermal dissipation system according to claim 11, wherein the opening is disposed below the heat source.

15. The thermal dissipation system according to claim 11, wherein the thermal connector includes a top segment, a middle segment extending from the top segment, and a bottom segment extending form the middle segment, the top segment being configured for insertion through the opening to engage the at least one of the heat source and the printed circuit board in thermal communication.

16. The thermal dissipation system according to claim 15, wherein the middle segment includes a flange extending radially therefrom, the flange configured for engagement with the bottom surface of the printed circuit board when the top segment is inserted through the opening in the printed circuit board.

17. The thermal dissipation system according to claim 15, wherein the bottom segment is configured for insertion into a receptacle extending through the heat dissipating element and configured for mechanical securement thereto.

18. The thermal dissipation system according to claim 17, wherein the fixation element is configured for insertion through the receptacle of the heat dissipating element, the fixation element configured to engage the bottom segment and the heat dissipating element to secure the bottom segment to the heat dissipating element.

19. The thermal dissipation system according to claim 17, wherein the receptacle of the heat dissipating element is configured to at least partially receive a flange of the middle segment.

20. A thermal dissipation system for use with a printed circuit board assembly, the thermal dissipation system comprising:

a printed circuit board including a plurality of openings extending therethrough from a first surface to a second surface;

a plurality of heat sources disposed on the first surface of the printed circuit board, each heat source being disposed adjacent to one of the openings;

a plurality of thermal connectors, each thermal connector being inserted through one of the openings to engage a respective one of the heat sources in thermal communication and being configured to dissipate heat away from the respective one of the heat sources; and at least one heat dissipating element attached to the plurality of thermal connectors by a corresponding fixation element, the at least one heat dissipating element configured to dissipate heat received by the plurality of thermal connectors from the plurality of heat sources.

* * * * *